United States Patent
Choi et al.

(10) Patent No.: US 12,463,081 B2
(45) Date of Patent: Nov. 4, 2025

(54) APPARATUS INCLUDING A BONDING HEAD AND A METHOD OF USING THE SAME

(71) Applicant: CANON KABUSHIKI KAISHA, Tokyo (JP)

(72) Inventors: Byung-Jin Choi, Austin, TX (US); Anshuman Cherala, Austin, TX (US); Mario Johannes Meissl, Austin, TX (US); Nilabh K. Roy, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 91 days.

(21) Appl. No.: 18/326,473

(22) Filed: May 31, 2023

(65) Prior Publication Data
US 2024/0404867 A1    Dec. 5, 2024

(51) Int. Cl.
*H01L 21/683* (2006.01)
*H01L 21/67* (2006.01)
*H01L 23/00* (2006.01)

(52) U.S. Cl.
CPC .... *H01L 21/6838* (2013.01); *H01L 21/67092* (2013.01); *H01L 24/80* (2013.01); *H01L 2224/80009* (2013.01); *H01L 2224/80201* (2013.01); *H01L 2224/80896* (2013.01); *H01L 2224/80908* (2013.01)

(58) Field of Classification Search
CPC . H01L 2224/80908; H01L 2224/80896; H01L 2224/80201; H01L 2224/80009; H01L 24/80; H01L 21/67092; H01L 21/6838
See application file for complete search history.

(56) References Cited

U.S. PATENT DOCUMENTS

| | | |
|---|---|---|
| 7,117,581 B2 | 10/2006 | Arneson et al. |
| 7,224,443 B2 | 5/2007 | Choi et al. |
| 7,504,268 B2 | 3/2009 | GanapathiSubramanian et al. |

(Continued)

FOREIGN PATENT DOCUMENTS

| | | |
|---|---|---|
| WO | 2022212260 A1 | 10/2022 |
| WO | 2023056068 A1 | 4/2023 |
| WO | 2023056072 A1 | 4/2023 |

OTHER PUBLICATIONS

"Electrostatic Discharge Materials," Wikipedia The Free Encyclopedia, retrieved Mar. 31, 2023, pp. 1-3, <https://en.wikipedia.org/wiki/Electrostatic_discharge_materials>.

(Continued)

*Primary Examiner* — Vishal I Patel
(74) *Attorney, Agent, or Firm* — Abel Schillinger, LLP

(57) ABSTRACT

An apparatus can include a bonding head. The bonding head can include a bonding head body, a die chuck body, and lands. The bonding head body can be coupled to the die chuck. The lands can define zones. The lands and zones can be configured so that an outer zone can be under vacuum to hold a die while an inner zone is pressurized to cause the die to bow away from the bonding head. The bowed die has a relatively smoother curvature as compared to a die bent by bowing a die chuck that has pins, lands, or both. When the die contacts a substrate using the novel bonding head, the likelihood of trapping air and creating a void during a bonding operation is significantly reduced.

14 Claims, 14 Drawing Sheets

(56) References Cited

U.S. PATENT DOCUMENTS

| | | |
|---|---|---|
| 7,798,801 B2 | 9/2010 | Babbs et al. |
| 8,033,813 B2 | 10/2011 | Cherala et al. |
| RE47,483 E | 7/2019 | Resnick et al. |
| 10,578,984 B2 | 3/2020 | Meissl et al. |
| 11,587,795 B2 | 2/2023 | Lu |
| 2004/0072385 A1 | 4/2004 | Bauer et al. |
| 2012/0313332 A1 | 12/2012 | Jeon et al. |
| 2017/0179077 A1 | 6/2017 | Lin et al. |
| 2022/0344179 A1* | 10/2022 | Ip .................. H01L 21/6875 |
| 2023/0245996 A1 | 8/2023 | Sreenivasan |
| 2023/0378125 A1* | 11/2023 | Yu .................. H01L 21/67092 |
| 2024/0170442 A1* | 5/2024 | Cheung ............. H01L 21/677 |

OTHER PUBLICATIONS

Wikipedia, "Electrostatic discharge materials", accessed Mar. 31, 2023, pp. 1-3.

* cited by examiner

APPARATUS INCLUDING A BONDING HEAD AND A METHOD OF USING THE SAME

FIELD OF THE DISCLOSURE

The present disclosure relates to apparatuses including bonding heads and methods of using the apparatuses.

RELATED ART

Advanced packaging technologies demand precise and accurate placement of dies. Hybrid bonding is becoming more prevalent as dimensions of features of dies and features along a surface of a destination substrate continue to shrink. A die can be bent to allow for the placement of the die along a surface of a substrate. FIG. 1 includes an illustration of a die 122, a portion of die chuck of a bonding head, where the die chuck includes a mesa 134 and pins and lands 152, and a substrate 148. When the die 122 is transferred to the bonding head, the die chuck is not bowed, and zones between the pins and lands 152 can be evacuated to hold the die 122 against the pins and lands 152. While the die 122 is held by the die chuck, the die 122 can be bent by bowing the die chuck as illustrated in FIG. 1. The die 122 can conform to the shapes of the pins and lands 152 resulting in a jagged surface along the side of the die 122 facing the substrate 148. During initial contact between the die 122 and the substrate 148, air can become trapped and form voids between the die 122 and the substrate 148. The voids can prevent the formation of proper interconnects between the die 122 and the substrate 148. Further, bowing the die chuck can generate shear forces along the die surface. The die 122 can become stretched or may slip at one or more of the pins and lands 152. The likelihood of overlay error can significantly increase using the method corresponding to FIG. 1. A need exists for placement of dies onto a substrate with a reduced risk of void formation and less overlay error.

SUMMARY

In an aspect, an apparatus can include a bonding head. The bonding head can include a bonding head body and a die chuck body coupled to the bonding head body and having a proximal side and a distal side, wherein the bonding head body is closer to the proximal side than to the distal side. The bonding head can also include a first land closer to the distal side than to the proximal side; a second land closer to the distal side than to the proximal side, wherein the second land is spaced apart from and laterally surrounded by the first land, a first zone is disposed between the first land and the second land, and a second zone is laterally surrounded by the second land. The bonding head can further include a first pressure actuator configured to provide a first vacuum within the first zone, wherein the first vacuum is sufficient to hold a die; and a second pressure actuator and configured to provide a pressure to the second zone, wherein the pressure is sufficient to bow the die while the die is being held by the first vacuum within the first zone.

In an embodiment, the die chuck body is configured to transmit less than 9% of radiation in a range from 100 nm to 1000 nm.

In another embodiment, the die chuck body includes a material present in a sufficient amount to dissipate electrical charge.

In still another embodiment, the apparatus does not have a radiation source configured to emit radiation along the proximal side of the die chuck body, wherein the radiation is in a range from 100 nm to 1000 nm.

In yet another embodiment, the die chuck body is releasably coupled to the bonding head body.

In a further embodiment, the apparatus further includes a holding means for holding the bonding head body and the die chuck body together.

In another embodiment, the apparatus further includes a third land laterally surrounding the first land, wherein a third zone disposed between the first land and the third land.

In a particular embodiment, the apparatus further includes a sensor to sense a state of the third zone.

In another particular embodiment, the apparatus further includes a holding means for holding the bonding head body and the die chuck body together, wherein the holding means comprises a third pressure actuator coupled to the third zone, wherein a combination of the first pressure actuator and the third pressure actuator are configured to provide a second vacuum sufficient to hold the die chuck body and the bonding head body together.

In still another embodiment, the apparatus further comprises a first drive means configured to generate a pressure in a range from 0.5 N/cm$^2$ to 20 N/cm$^2$ between the first land of the bonding head and an object while the first land of the bonding head and the object are in contact with each other.

In yet another embodiment, the apparatus further includes a mesa disposed between the die chuck body and each of the first land and the second land.

In a further embodiment, the apparatus further includes a pin within the second zone.

In a particular embodiment, the pin, the first land, and the second land have surfaces that lie at substantially a same elevation from the distal side of the die chuck body.

In another aspect, an apparatus can include a first bonding head, a second bonding head, and a controller. The first bonding head can include a first bonding head body; and a first die chuck body coupled to the first bonding head body and having a first proximal side and a first distal side, wherein the first bonding head body is closer to the first proximal side than to the first distal side. The first bonding head can also include a first land closer to the first distal side than to the first proximal side; and a second land closer to the first distal side than to the first proximal side, wherein the second land is spaced apart from and laterally surrounded by the first land, a first zone is disposed between the first land and the second land, and a second zone is laterally surrounded by the second land. The first bonding head can further include a first pressure actuator configured to provide a first vacuum within the first zone, wherein the first vacuum is sufficient to hold a first die; and a second pressure actuator configured to provide a first pressure to the second zone, wherein the first pressure is sufficient to bow the first die while the first die is being held by the first vacuum within the first zone.

The second bonding head can include a second bonding head body; and a second die chuck body coupled to the second bonding head body and having a second proximal side and a second distal side, wherein the second bonding head body is closer to the second proximal side than to the second distal side. The second bonding head can also include a third land closer to the second distal side than to the second proximal side; and a fourth land closer to the second distal side than to the second proximal side, wherein the fourth land is spaced apart from and laterally surrounded by the third land, a third zone is disposed between the third land and the fourth land, and a fourth zone is disposed laterally surrounded by the fourth land The second bonding head can further include a third pressure actuator configured to provide a second vacuum within the third zone, wherein the second vacuum is sufficient to hold a second die; and a fourth pressure actuator configured to provide a second pressure to the fourth zone, wherein the second pressure is sufficient to bow the second die while the second die is being held by the second vacuum within the third zone.

The controller can be configured such that the first bonding head can bond the first die to a destination substrate and the second bonding head can bond the second die to the destination substrate during a same point in time.

In a further aspect, a method can include holding a die with a bonding head. The bonding head can include a bonding head body; and a die chuck body coupled to the bonding head body and having a proximal side and a distal side, wherein the bonding head body is closer to the proximal side than to the distal side. The bonding head can also include a first land closer to the distal side than to the proximal side; and a second land closer to the distal side than to the proximal side, wherein the second land is spaced apart from and laterally surrounded by the first land, a first zone is disposed between the first land and the second land, and a second zone is laterally surrounded by the second land. The bonding head can further include a first pressure actuator configured to provide a first vacuum within the first zone, wherein the first vacuum is sufficient to hold the die; and a second pressure actuator configured to provide a pressure to the second zone, wherein the pressure is sufficient to bow the die while the die is being held by the first vacuum within the first zone. The method can further include bowing the die while the die is being held by the bonding head.

In an embodiment, the method further includes bringing the die and a bonding site of a destination substrate in contact while the die is bowed.

In another embodiment, holding the die with the bonding head comprises holding the die with the bonding head, wherein the bonding head includes a third land laterally surrounding the first land, wherein a third zone disposed between the first land and the third land.

In a particular embodiment, holding the die with the bonding head comprises holding the die with the bonding head, wherein a portion of the third zone is not sufficiently covered by the die, the bonding head includes a third pressure actuator configured to provide a third vacuum within the third zone, and the third pressure actuator is not activated during holding the die.

In another particular embodiment, holding the die with the bonding head comprises holding the die with the bonding head, wherein the bonding head includes a sensor to sense a state of the third zone, and the method further comprises sensing that the third zone is not sufficiently covered by the die, wherein sensing is performed using the sensor.

BRIEF DESCRIPTION OF THE DRAWINGS

Implementations are illustrated by way of example and are not limited in the accompanying figures.

Figure 1:
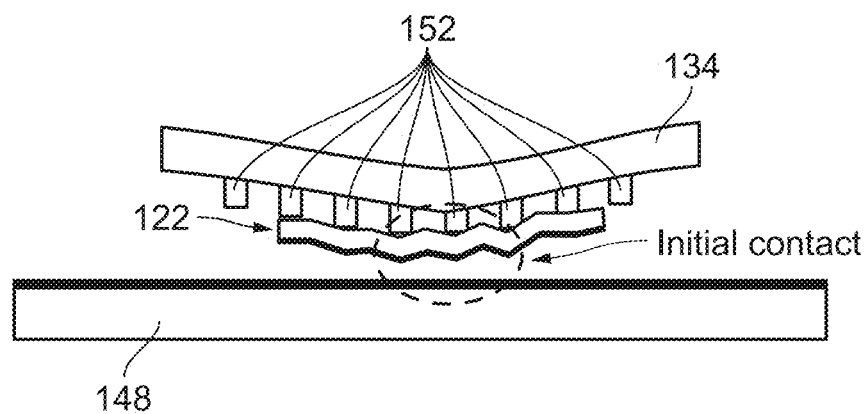
FIG. 1 includes an illustration of a cross-sectional view of a portion of a die chuck, a die, and a substrate when a die chuck is bowed causing the die to bend at pins or lands along a surface of the die chuck.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations and implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the arts.

An apparatus can include a bonding head. The bonding head can include a bonding head body, a die chuck body, and lands. The bonding head body can be coupled to the die chuck. The lands can define zones. The lands and zones can be configured so that an outer zone can be under vacuum to hold a die while an inner zone is pressurized to cause the die to bow away from the bonding head. The die being bowed by a pressurized gas allows a more gradual curvature along the surface of the die that initially makes contact with the destination substrate. Using any of the apparatuses and method described herein, the surface of the die is less likely to have a jagged surface as seen with the die 122 in FIG. 1. Thus, the apparatuses and methods are less likely to allow air to become trapped between the dies and the destination substrate resulting in an undesired void. Overlay error between the die and the destination substrate is reduced.

A variety of designs can be used for the mesa, lands, and pins (if pins are present) for the die chuck coupled to the bonding head body. The design illustrated in FIGS. 5 and 6 allows for a relatively simple design that works well for different types of dies that occupy similar areas. The design illustrated in FIG. 8 has a plurality of zones that can be used for different types of dies having different sizes. Thus, die chucks having a design corresponding to FIG. 8 may not need to be changed as frequently as compared to the design in FIGS. 5 and 6. The design illustrated in FIG. 9 has pins in addition to lands. The pins can help to keep a die from being pulled as far into a zone when the zone is evacuated as compared to the same design without pins. Further, the pins can help provide contact to a side of a die to help in the bonding operation.

The apparatus and method are understood better after reading this specification in conjunction with the figures. Implementations described below are exemplary and do not limit the scope of the invention as defined in the appended claims. While some die chucks will be described mostly with respect to an array of pick-up heads, and other die chucks will be described mostly with respect to an array of bonding heads, the die chucks for the array of pick-up heads may be used for the array of bonding heads, and the die chucks for the array of bonding heads may be used for the array of pick-up heads.

Figure 2:
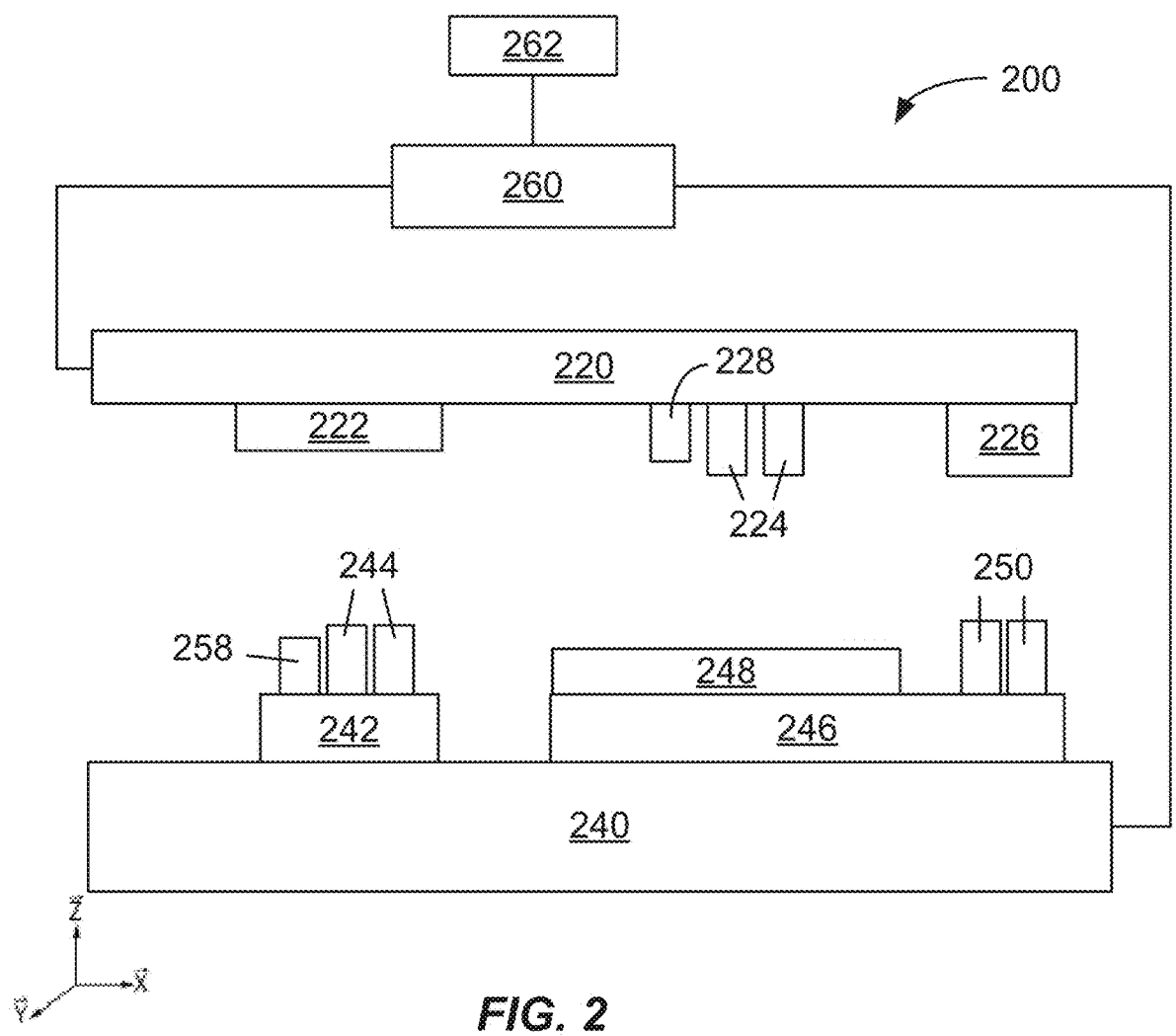
FIG. 2 includes a conceptual view of an apparatus that can be used in transferring dies from a source substrate to a destination substrate.

FIG. 2 includes a conceptual diagram of an apparatus 200 that can be used to transfer dies coupled to a source chuck 222 to a destination substrate coupled to a destination chuck 248. FIG. 2 includes the equipment configuration of the apparatus 200 and does not include the dies and the destination substrate. The apparatus 200 includes a bridge 220, a base 240, and a controller 260 that is coupled to the bridge 220, the base 240, or to one or more components coupled to the bridge 220 or the base 240. The bridge 220 can be coupled to a source chuck 222, an array of bonding heads 224, a reference 226 having one or more alignment marks, and registration hardware 228. The base 240 can be coupled to a pick-up head carriage 242 and a destination carriage 246.

In FIG. 2 and other figures, the bridge 220, the base 240, and components physically coupled between the bridge 220 or the base 240 can be organized along an X-direction, a Y-direction, a Z-direction, or a combination thereof. With respect to cross-sectional or side views, the X-direction is between the left-hand and right-hand sides of the drawings, the Z-direction is between the top and bottom of the drawings, and the Y-direction is into and out of the drawing sheet. Unless explicitly stated to the contrary, rotation occurs along an X-Y plane defined by the X-direction and Y-direction.

Components within the apparatus 200 will be generally described in the order in which a set of dies will be transferred from a source substrate coupled to the source chuck 222 to a destination substrate coupled to the destination chuck 248. Due to similarities in operation, the pick-up head carriage 242 and the destination carriage 246 are described in the same passage later in this specification.

The terms "transfer operation" and "transfer cycle" are addressed to aid in understanding embodiments as described herein. A transfer operation starts no later than picking up a set of dies from the source substrate, where the set of dies will be the first set of dies transferred to the destination substrate and ends when the last set of dies is transferred to the destination substrate. A transfer cycle starts no later than picking up a particular set of dies from the source substrate until that same particular set of dies is transferred to the destination substrate. A transfer operation can include one or more transfer cycles.

The source chuck 222 can be a vacuum chuck, a pin-type chuck, a groove-type chuck, an electrostatic chuck, an electromagnetic chuck, or the like. The source chuck 222 can be coupled to the bridge 220 by being attached to the bridge directly or can be coupled to the bridge via a carriage (not illustrated). The source chuck 222 has a source holding surface that faces the base 240 or a component coupled to the base 240. The carriage may be able to provide translating motion as described in more detail below with respect to the pick-up head carriage 242 and the destination carriage 246.

The pick-up head carriage 242 and the destination carriage 246 are coupled to the base 240 and can provide translating motion along the base 240 in an X-direction, a Y-direction, or a Z-direction or rotational motion about one or more of axes, such as rotation about the Z-axis and along a plane lying along the X-direction and Y-direction. The pick-up head carriage 242 and the destination carriage 246 can be moved together or independently relative to each other. The pick-up head carriage 242 and the destination carriage 246 can be the same type or different types of carriages.

An array of pick-up heads 244 are coupled to the pick-up head carriage 242 and have pick-up surfaces that face the bridge 220 or a component coupled to the bridge 220. The array of pick-up heads 244 can be configured as a vector (a row or a column of pick-up heads) or as a matrix (at least two rows and at least two columns of pick-up heads). Regarding the matrix, the number of bonding heads within the array of pick-up heads 244 may be different between rows, between columns, or between rows and columns. Some array configurations can include 3×1, 6×1, 2×2, 2×3, 2×4, 4×2, 10×10, or another rectangular shape, where the first number corresponds to the number of pick-up heads along a row or column, and the second number corresponds to the number of pick-up heads along the other of the row or column. In theory, dies from an entire source wafer may be transferred all at once. For such a configuration, from a top view, the array of pick-up heads 244 may have fewer pick-up heads along rows closer to the top and bottom of the array as compared to the row or the pair of rows closest to the center of the array, and the array of pick-up heads 244 may have fewer pick-up heads along columns closer to the left-hand side and right-hand side of the array as compared to the column or the pair of columns closest to the center of the array. After reading this specification, skilled artisans will be able to determine an array configuration for the array of pick-up heads 244 that meets the needs or desires for a particular application.

Figure 3:
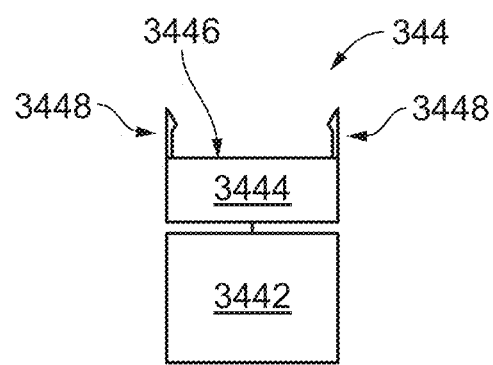
FIG. 3 includes an illustration of a cross-sectional view of a pick-up head that can be used in an implementation.

FIG. 3 includes an exemplary design for a pick-up head 344 within the array of pick-up heads 244. In FIG. 3, the pick-up head 344 includes a body 3442 and a die chuck 3444. When the pick-up head 344 is installed, the body 3442 is disposed between the pick-up head carriage 242 and the die chuck 3444.

The pick-up head 344 has a pick-up surface 3446 that faces the source chuck 222 illustrated in FIG. 2. A die may or may not contact the pick-up surface 3446. For example, a die may have an activated surface to assist in hybrid bonding. The pick-up head 344 may include die retention projections 3448 that can extend from the die chuck 3444 to allow the die to be held along sides between the major surfaces of the die without an activated surface of the die contacting the pick-up surface 3446. If the die is too thin, a backing plate can be attached to the die, such that the die is disposed between the backing plate and the pick-up surface 3446. The die retention projections 3448 can contact the backing plate as the die is moved from the source chuck 222 to a bonding head within the array of bonding heads 224. Another configuration of the pick-up head may allow a die to be retained by a die chuck without an activated surface of the die contacting a pick-up surface of the pick-up head. Accordingly, the pick-up head 344 in FIG. 3 is exemplary and does not limit the scope of the invention as defined in the appended claims. In an alternative embodiment, the pick-up head may be retained by the pick-up carriage 242 using a chuck that is a vacuum chuck, a pin-type chuck, a groove-type chuck, an electrostatic chuck, a Bernoulli chuck, or an electromagnetic chuck.

The array of pick-up heads 244 can be configured to have an adjustable pitch that can be reversibly changed between a source-matching pitch and a bonding head matching pitch. The array of pick-up heads 244 or the pick-up head carriage 242 can include motors, electrical components or the like that can be activated to move pick-up heads to achieve a desired pitch. The apparatus 200 can be configured to allow at least one pitch change per transfer cycle. On average, the pitch for the array of pick-up heads 244 can be changed twice during a transfer cycle. As used herein, a pitch is the sum of a width or a length of a feature and the space between the feature and the immediately adjacent feature. The features can be dies at a source substrate, pick-up heads within the array of pick-up heads 244, bonding heads within the array of bonding heads 224, or bonding sites of the destination substrate. The pitch along the X-direction may be the same or different from the pitch in the Y-direction.

In an embodiment, the array of pick-up heads 244 can be at the source-matching pitch when picking up a set of dies from the source chuck 222 and at the bonding head-matching pitch when transferring the dies to the array of bonding heads 224. The source-matching pitch for the array of pick-up heads 244 should be the same as the source pitch of dies to be picked up from a source substrate that is coupled to the source chuck 222, and the bonding head-matching pitch for the array of pick-up heads 244 should be the same as a bonding head pitch for bonding heads within the array of bonding heads 224. In practice, the source-matching pitch is usually slightly different from the source pitch, and the bonding head-matching pitch is usually slightly different from the bonding head pitch. A successful die transfer can occur when the difference between the source-matching pitch and the source pitch, the difference between the bonding head-matching pitch and the bonding head pitch, or both are within acceptable tolerances to allow for the proper picking up and transferring of the dies. A tolerance may be in a form of a production specification associated with equipment or a method when using the equipment. The source pitch, the source-matching pitch, the bonding head pitch, the bonding head-matching pitch, or a combination thereof may be stored within the memory 262 or another memory external to the apparatus 200.

After the dies are transferred to the array of bonding heads 224, the pitch for the array of pick-up heads 244 can be changed from the bonding head-matching pitch to the source-matching pitch before picking up the next set of dies for the next transfer cycle. The changing of the pitch can be performed with or without human intervention. In an embodiment, a signal from the bridge 220, the base 240, or any one or more components coupled to the bridge 220 or the base 240 can be transmitted to the controller 260 or a local controller that an action has been completed, and such controller can transmit a signal to change the pitch for the array of pick-up heads 244. For example, after the array of pick-up heads 244 have picked up a set of dies from the source substrate, a signal can be transmitted to the controller 260 or a local controller that picking up the set of dies has been completed. In response to the signal, the controller 260 or a local controller can transmit a signal for changing the pitch for the array of pick-up heads 244 from the source-matching pitch to the bonding head-matching pitch. After the array of pick-up heads 244 have transferred the set of dies to the array of bonding heads 224, a signal can be transmitted to the controller 260 or a local controller that the transfer from the array of pick-up heads 244 to the array of bonding heads 224 has been completed. In response to the signal, the controller 260 or a local controller can transmit a signal for changing the pitch for the array of pick-up heads 244 from the bonding head-matching pitch to the source-matching pitch.

Similar to the array of pick-up heads 244, the array of bonding heads 224 can be configured as a vector (a row or a column of bonding heads) or as a matrix (at least two rows and at least two columns of bonding heads). Regarding the matrix, the number of bonding heads within the array of bonding heads 224 may be different between rows, between columns, or between rows and columns. Some array configurations can include 3×1, 6×1, 2×2, 2×3, 2×4, 4×2 10×10, or another rectangular shape, where the first number corresponds to the number of bonding heads along a row or column, and the second number corresponds to the number of bonding heads along the other of the row or column. In theory, dies from an entire wafer may be transferred all at once. For such a configuration, from a bottom view, the array of bonding heads 224 may have fewer bonding heads along rows closer to the top and bottom of the array as compared to the row closest to the center of the array, and the array of bonding heads 224 may have fewer bonding heads along columns closer to the left-hand side and right-hand side of the array as compared to the column closest to the center of the array. After reading this specification, skilled artisans will be able to determine an array configuration for the array of bonding heads 224 that meets the needs or desires for a particular application. In an embodiment, the array of bonding heads 224 has the same number of rows and columns as compared to the array of pick-up heads 244.

Figure 4:
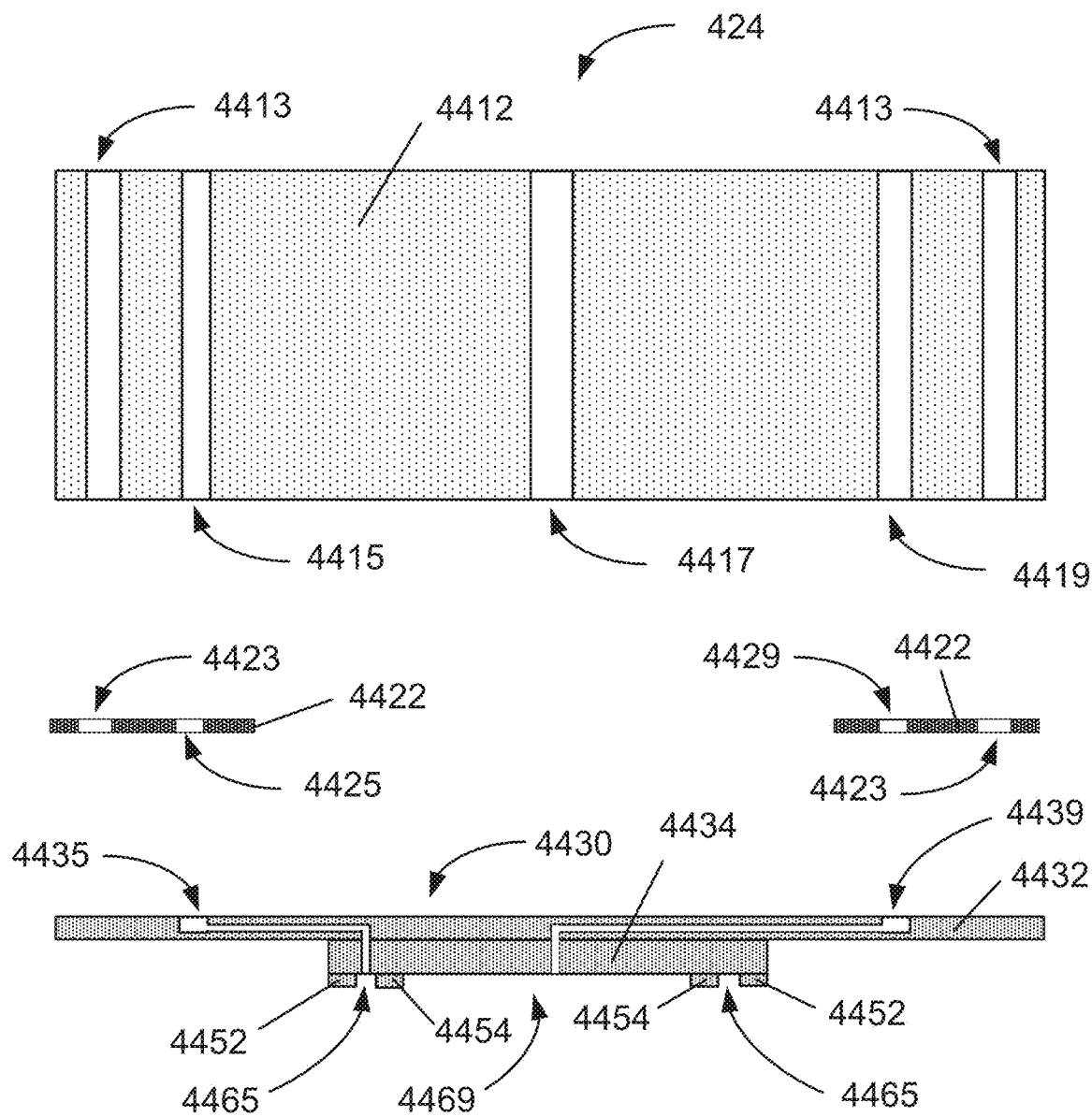
FIG. 4 includes an illustration of an exploded, cross-sectional view of a portion of a bonding head in accordance with an implementation.
Figure 5:
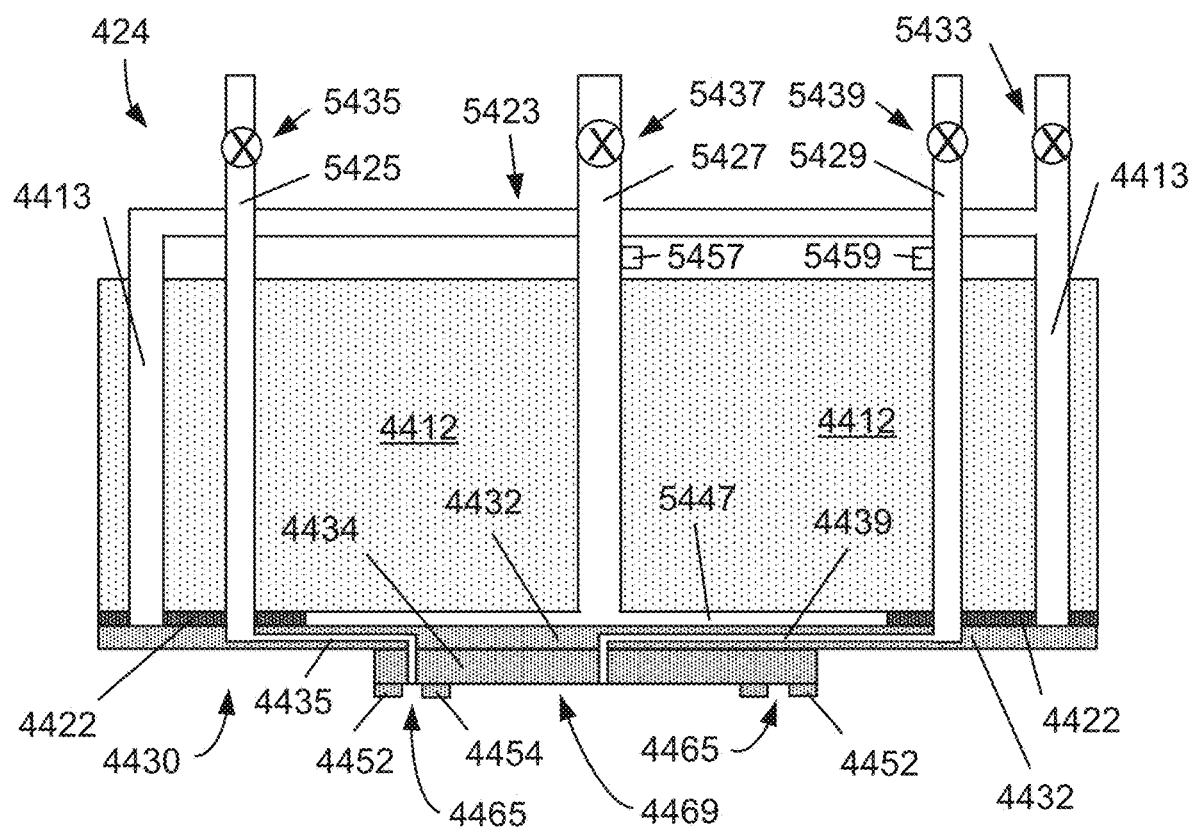
FIG. 5 includes an illustration of a cross-sectional view of the bonding head of FIG. 4 after the bonding head is assembled.
Figure 6:
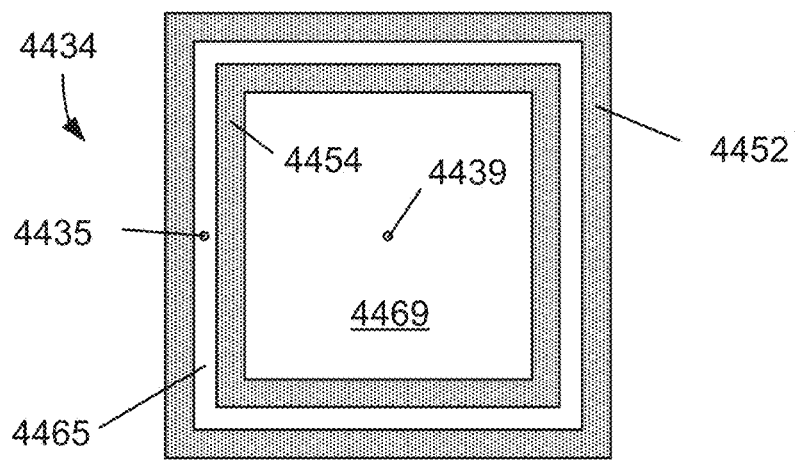
FIG. 6 includes an illustration of a bottom view of a portion of a die chuck that includes a mesa, lands, zones, and flow channels.

The array of bonding heads 224 are coupled to the bridge 220. Referring to FIGS. 4 to 6, a bonding head 424 can be used for any or all of the bonding heads within the array of bonding heads 224. FIG. 4 includes an exploded cross-sectional view of a portion of the bonding head 424, FIG. 5 includes a cross-sectional view of the portion of the bonding head 424 when assembled, and FIG. 6 includes a bottom view of a mesa 4434, lands 4452 and 4454, zones 4465 and 4469, and ports for a flow channel 4435 coupled to the zone 4465 and for a flow channel 4439 coupled to the zone 4469.

The bonding head 424 includes a bonding head body 4412, a sealing member 4422, and a die chuck 4430. The die chuck 4430 and the bonding head body 4412 can be coupled using a vacuum, an electrostatic charge, an electromagnetic attraction, or the like. The description below addresses a vacuum-based system. An electrostatic and electromagnetic systems are addressed later in this specification.

The bonding head body 4412 has flow channels 4413 that allow a vacuum to hold the bonding head body 4412 and the die chuck 4430 together. The bonding head body 4412 further includes a flow channel 4415 that allows a vacuum to hold a die to the die chuck 4430. The bonding head body 4412 also includes a flow channel 4417 that allows a pressurized gas to bow the die chuck 4430 when the die chuck 4430 and the bonding head body 4412 are coupled together. The bonding head body 4412 further includes a flow channel 4419 that allows a pressurized gas to bow a die when the die and the die chuck 4430 are coupled together.

The bonding head body 4412 can be made of a metal, a metal alloy, a glass, a ceramic, a plastic, a composite, or another suitable material. A composite material is a material made out of two or more materials. A typical composite material can include a fiber like material (glass fiber, carbon fiber, etc.) and a matrix (ceramic, polymer, etc.). The flow channels 4413, 4415, 4417, and 4419 can be defined by removing portions of the bonding head body 4412 by drilling, cutting, etching, or another suitable technique. Alternatively, material for the bonding head body 4412 can be formed and laterally surround solid objects, such as rods that correspond to the flow channels 4413, 4415, 4417, and 4419. After the shape of the bonding head body 4412 is achieved, the rods can be removed leaving the flow channels 4413, 4415, 4417, and 4419. More or fewer flow channels can be used.

When assembled, as illustrated in FIG. 5, the sealing member 4422 can lie along a peripheral edge of the bonding head body 4412. The sealing member 4422 can perform a function similar to a gasket. Thus, the sealing member 4422 has a relatively large opening in the center that helps to define a pressurization region 5447 (in FIG. 5) that is coupled to the flow channel 4417. The sealing member 4422 includes flow channels 4423 and 4425 and a flow channel 4429. The flow channels 4423 allow a vacuum to hold the die chuck 4430 in place relative to the bonding head body 4412. The flow channel 4425 allows a vacuum to reach a side of the die chuck 4430 to hold a die from the plurality of dies (not illustrated in FIG. 2, 4, or 5). The flow channel 4429 allows a pressurized gas to reach a side of the die chuck 4430 to bow the die while the die is being held by the die chuck 4430.

Referring to FIGS. 4 and 5, the sealing member 4422 can include any of the materials as previously described with respect to the bonding head body 4412. The sealing member 4422 can include an elastomeric material (for example, a silicone, a polybutylene material, or a rubber material). The material for the sealing member 4422 can be the same or different from the bonding head body 4412. Depending on the material of the sealing member 4422, one or more of the previously described techniques with respect to forming the bonding head body 4412 can be used in achieving the shape of the sealing member 4422 as illustrated in FIGS. 4 and 5. The technique to form the sealing member 4422 can be the same or different from the technique used to form the bonding head body 4412. In an embodiment, the sealing member 4422 can be a single annular component or may be a set of components, for example a set of O-rings.

The die chuck 4430 includes a die chuck body 4432, the mesa 4434, and the lands 4452 and 4454. The die chuck body 4432 can be releasably coupled to the bonding head body 4412. The die chuck body 4432 has a proximal side and a distal side opposite the proximal side, wherein the proximal side of the die chuck body 4432 is disposed between the bonding head body 4412 and the distal side of the die chuck body 4432. The mesa 4434 has a proximal side and a distal side opposite the proximal side, wherein the proximal side of the mesa 4434 is disposed between the die chuck body 4432 and the distal side of the mesa 4434.

Referring to FIGS. 4 to 6, the lands 4452 and 4454 are coupled to the die chuck body 4432 via the mesa 4434. In the same or different implementation, the lands 4452 and 4454 extend from a distal side of the mesa 4434 and are coupled to the die chuck body 4432. The peripheral sides of the mesa 4434 are closer to the land 4452 than to the land 4454. The land 4454 is spaced apart from the land 4452. Each of the lands 4452 and 4454 has a proximal side and a distal side opposite the proximal side, wherein the proximal side of each of the lands 4452 and 4454 is disposed between the mesa 4434 and the distal side of the corresponding land. The zone 4465 is disposed between the lands 4452 and 4454, and the zone 4469 is laterally surrounded by the land 4454. The die chuck may be selected such that the die 1522 is larger than the width between the outermost lands 4452.

Surfaces along the distal sides of the lands 4452 and 4454 are substantially co-planar. In an implementation, the surfaces along the distal sides of the lands 4452 and 4454 can lie along planes that are within 5° of being co-planar. The lands 4452 and 4454 may be offset in the Z-axis, such that the distal surface of the land 4452 is at an elevation, as measured in the Z-direction, that is within 9 microns of the elevation of the distal surface of the land 4454.

A flow channel 4435 can extend from the proximal side of the die chuck body 4432 to the zone 4465 disposed between the lands 4452 and 4454. The flow channel 4435 can be coupled to the flow channel 4425 of the sealing member 4422 and the flow channel 4415 of the bonding head body 4412. A flow channel 4439 can extend from the proximal side of the die chuck body 4432 to the zone 4469. The flow channel 4439 can be coupled to the flow channel 4429 of the scaling member 4422 and the flow channel 4419 of the bonding head body 4412. When a die (not illustrated in FIGS. 4 to 6) lies along the lands 4452 and 4454, a pressurized gas can be introduced into the zone 4469 and bow the die while a vacuum within the zone 4465 holds the die against the lands 4452 and 4454.

The die chuck 4430 can be formed from a single piece of material or may be formed from at least two different pieces of material. Regarding the latter, the die chuck body 4432 may be formed from one piece of material, and the mesa 4434 and the lands 4452 and 4454 can be formed from another piece of material. The material composition of any or all of the die chuck body 4432, the mesa 4434, and the lands 4452 and 4454 can be any of the materials as previously described with respect to the bonding head body 4412. The bonding head body 4412 can include the same or different material as compared to any or all of the die chuck body 4432, the mesa 4434, and the lands 4452 and 4454. In the same or different implementation, the body 4432, the mesa 4434, and the lands 4452 and 4454 can include the same material or a different material as compared to one another.

In the same or a further implementation, for radiation in a range from 100 nm to 1000 nm, any or all of the die chuck body 4432, the mesa 4434, and the lands 4452 and 4454, or a combination the die chuck body 4432 and the mesa 4434 can transmit less than 9%, less than 5%, less than 1%, or none of such radiation of when the proximate side of the die chuck body 4432 is irradiated by such radiation. The bonding head 424 does not include a radiation source configured to emit such radiation along the proximal side of the die chuck body 4432.

A bonding head within array of bonding heads 224 can be used with a die, wherein the die includes an electrical component, such as a transistor or a capacitor, or a circuit that is sensitive to electrostatic discharge. The electrical component or circuit can be within a microprocessor, a microcontroller, a graphic processing unit, a digital signal processor, a memory die (for example, a Level 2 or Level 3 cache, a flash memory, or the like), a power transistor die, a power circuit die, or the like. The bonding head body 4412, the sealing member 4422, and the die chuck 4430, including the die chuck body 4432, the mesa 4434, and the lands 4452 and 4454, or any combination thereof can include a conductive or static dissipative material.

The material can be present in a sufficient amount to dissipate electrical charge. In an implementation, such material can allow any or all of the bonding head body 4412, the sealing member 4422, and the die chuck 4430, including the die chuck body 4432, the mesa 4434, and the lands 4452 and 4454, to have a resistivity of at most $1\times10^{12}$ Ω/square, at most $1\times10^{9}$ Ω/square, or at most $1\times10^{6}$ Ω/square. In the same or different implementation, such material can allow any or all of the bonding head body 4412, the sealing member 4422, and the die chuck 4430, including the die chuck body 4432, the mesa 4434, and the lands 4452 and 4454, to have a resistivity of at least $1\times10^{-3}$ Ω/square, at least $1\times10^{1}$ Ω/square, or at least $1\times10^{6}$ Ω/square. In a particular implementation, such material can allow any or all of the bonding head body 4412, the sealing member 4422, and the die chuck 4430, including the die chuck body 4432, the mesa 4434, and the lands 4452 and 4454, to have a resistivity in a range from $1\times10^{-3}$ Ω/square to $1\times10^{12}$ Ω/square, $1\times10^{3}$ Ω/square to $1\times10^{6}$ Ω/square, or $1\times10^{6}$ Ω/square to $1\times10^{9}$ Ω/square. For example, the bonding head body 4412 can be metallic, and the die chuck 4430 can be a conductive polymer or an insulating polymer mixed with a sufficient amount of carbon so that the mixture of the insulating polymer and carbon has a resistivity as previously described.

FIG. 5 includes an illustration of the assembled bonding head 424 and its connections to components that can be used to change pressures within portions of the bonding head 424. Referring to FIGS. 4 and 5, the flow channels 4413 and 4423 are coupled to a manifold that are parts of a flow channel 5423. A pressure actuator 5433 can be used to evacuate the flow channel 5423. In an implementation, the pressure actuator 5433 can allow the flow channel 5423 to backfill and reach ambient pressure, and in the same or different implementation, the pressure actuator 5433 may allow the flow channel 5423 to reach a positive pressure. Ambient pressure (zero gauge pressure) is the pressure within the apparatus 200 outside of and near the bonding head 424. A vacuum pressure is less than ambient pressure and is a negative gauge pressure, and a positive pressure is higher than the ambient pressure and is a positive gauge pressure. When a pressure is at or near ambient pressure, the pressure may be ambient pressure+/−0.5 N/cm$^2$.

The flow channels 4415, 4425, and 4435 are parts of a flow channel 5425. A pressure actuator 5435 can be used to evacuate the flow channel 5425 and the zone 4465. In an implementation, the pressure actuator 5435 can allow the flow channel 5425 and the zone 4465 to backfill and reach ambient pressure, and in the same or different implementation, the pressure actuator 5435 may allow the flow channel 5425 and the zone 4465 to reach a positive pressure. A pressure actuator 5437 can be used to pressurize the flow channel 5427 and the pressurization region 5447. In an implementation, the pressure actuator 5437 can relieve pressure and allow the flow channel 5427 and the pressurization region 5447 to reach ambient pressure. A pressure actuator 5439 can be used to pressurize the flow channel 5429 and the zone 4469. In an implementation, the pressure actuator 5439 can relieve pressure and allow the flow channel 5429 and the zone 4469 to reach ambient pressure, and in the same or different implementation, the pressure actuator 5439 may allow the flow channel 5429 and the zone 4469 to be under vacuum.

Bonding heads within the array of bonding heads 224 can be arranged to have a bonding head pitch along the bridge 220. The bonding head pitch for the array of bonding heads 224 should be the same as the destination pitch, which is the pitch for bonding sites on the destination substrate. In practice, the bonding head pitch is usually different from the destination pitch. A successful die transfer can occur when the difference between the bonding head pitch and the destination pitch is within an acceptable tolerance.

The maximum allowable tolerance for the difference between the bonding head pitch for the array of bonding heads 224 and the destination pitch for the destination substrate is less than the maximum allowable tolerance for the difference between the bonding head pitch for the array of bonding heads 224 and the bonding head-matching pitch for the array of pick-up heads 244. The bonding heads within the array of bonding heads 224 are more accurately and precisely placed as compared to the pick-up heads within the array of pick-up heads 244. The positions for the bodies of the bonding heads within the array of bonding heads 224 are typically not changed during a transfer operation and may or may not be changed between transfer operations.

Referring to FIG. 2, the destination chuck 248 can be coupled to the destination carriage 246 and has a substrate holding surface facing the bridge 220 or a component coupled to the bridge 220. In an embodiment, the destination chuck 248 is attached to the destination carriage 246. The destination chuck 248 can hold a destination substrate having the bonding sites. The destination chuck 248 can be a vacuum chuck, a pin-type chuck, a groove-type chuck, an electrostatic chuck, an electromagnetic chuck, or the like. The destination chuck 248 can be heated, cooled, or both heated and cooled. The destination chuck 248 can include a heater. In the same or different embodiment, a fluid (not illustrated) can flow through the destination chuck 248 to increase or decrease the temperature of the destination chuck 248.

Alignment hardware 250 is coupled to the destination carriage 246, and the reference 226 is coupled to the bridge 220 and includes one or more alignment marks. The alignment hardware 250 can include an optical component and provide information to the controller 260 or a local controller located within the alignment hardware 250, the destination carriage 246, the base 240, or a combination thereof. The alignment hardware 250 can be used to align the destination carriage 246 to the one or more alignment marks of the reference 226, align the destination carriage 246 to the array of bonding heads 224, or both.

Registration hardware 228 and 258 are coupled to the bridge 220 and the pick-up head carriage 242, respectively. The registration hardware 228 and 258 can include an optical component and provide information to the controller 260 or a local controller located within the registration hardware 228 or 258, the bridge 220, the pick-up head carriage 242, the base 240, or a combination thereof. A source substrate, dies coupled to the source substrate, a destination substrate, or all of the foregoing can be registered in their respective stage coordinates before dies are transferred from the source substrate to the destination substrate. The information from the registration hardware 258 can be used to determine the source pitch for the plurality of dies 1222 (illustrated in FIG. 12). Further, the information may be used to identify or confirm the plurality of dies 1222 are the correct dies being transferred. The information from the registration hardware 228 can be used to determine the destination pitch for the bonding sites of the destination substrate 1248 (illustrated in FIG. 12). Further, the information may be used to identify or confirm the destination substrate 1248 is the correct substrate to which dies will be transferred.

Returning to FIG. 2, the apparatus 200 can be controlled by the controller 260 in communication with the bridge 220, any component coupled to the bridge 220, the base 240, any component coupled to the base 240, or a combination thereof. The controller 260 can operate using a computer readable program, optionally stored in memory 262. The controller 260 can include a processor (for example, a central processing unit of a microprocessor or microcontroller), a field-programmable gate array (FPGA), an application specific integrated circuit (ASIC), or the like. The controller 260 can be within the apparatus 200. In another implementation (not illustrated), the controller 260 can be at least part of a computer external to the apparatus 200, where such computer is bidirectionally coupled to the apparatus 200.

The memory 262 can include a non-transitory computer readable medium that includes instructions to carry out the actions associated with the transfer operation. In another embodiment, the bridge 220, a component coupled to the bridge 220, the base 240, or a component coupled to the base 240 can include a local controller that provides some of the functionality that would otherwise be provided by the controller 260.

Figure 7:
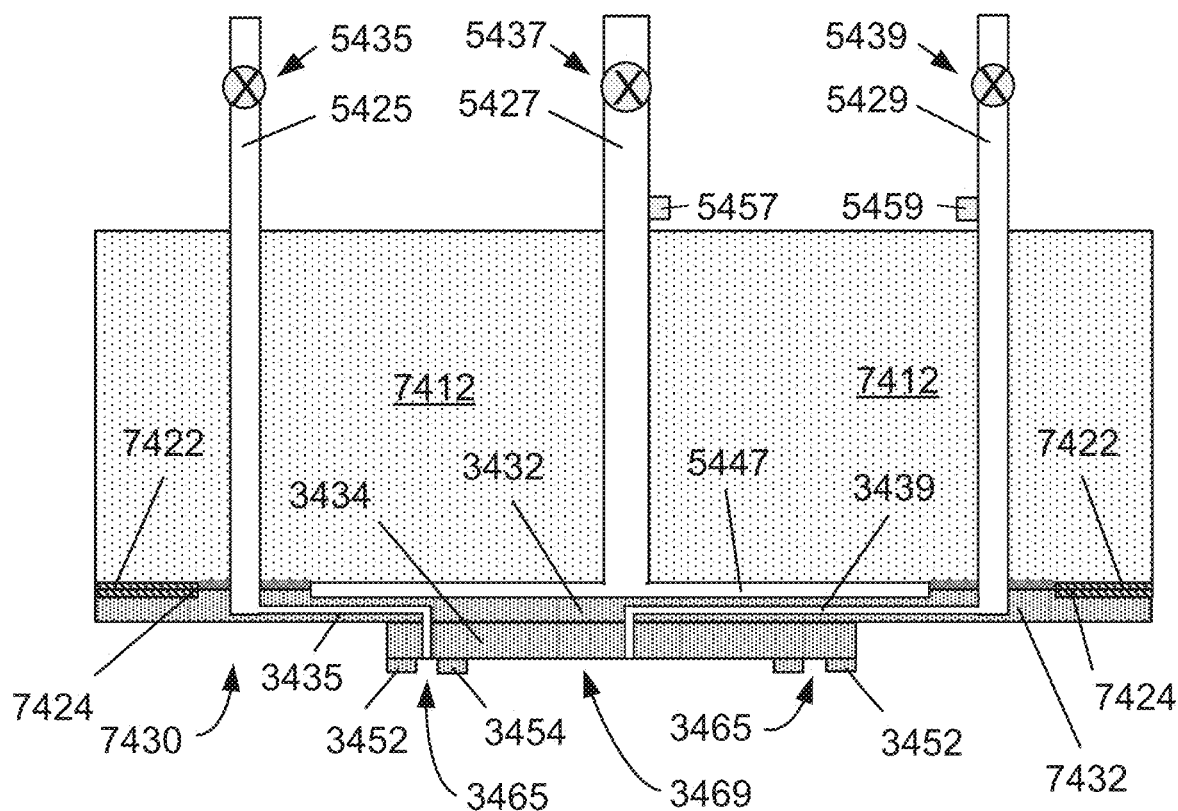
FIG. 7 includes an illustration of a cross-sectional view of a bonding head in accordance with another implementation.

The apparatus 200 can be modified and still achieve many of the benefits as described herein. As previously described, the die chuck 4430 can be retained by using a vacuum. FIG. 7 illustrates another implementation in which a die chuck 7430 can be releasably coupled to a bonding head body 7412, where releasably coupling can involve an electrical charge or electromagnetism. The die chuck 7430 includes a die chuck body 7432 that is similar to the die chuck body 4432. The bonding head body 7412 is similar to the bonding head body 4412 previously described. The flow channel 5432, including flow channels 4423, and the pressure actuator 5433 (illustrated in FIG. 5) are not used with the implementation illustrated in FIG. 7. A scaling member may or may not be disposed between the bonding head body 7412 and the die chuck 7430.

Coupling components 7422 and 7424 can be along surfaces or near the bonding head body 7412 and the die chuck body 7432, respectively. If any or all of the coupling components 7422 and 7424 are spaced apart from the contacting surfaces between bonding head body 7412 and the die chuck body 7432, such coupling components are sufficiently close to allow the bonding head body 7412 and the die chuck body 7432 to be held together.

The coupling component 7422 can be actuated by a circuit that allows current to flow to the coupling component 7422. The circuit can be controlled by the controller 260 or a local controller. When activated, the circuit allows current to flow to the coupling component 7422 and generate an electrical charge or a magnetic field, and the coupling component 7424 can be attracted to the die chuck 7430 and be retained by the electrical charge or the magnetic field. The coupling component 7422 can include an electrically conductive material, such as a metal or an alloy including the metal. The coupling component 7424 can include a metal or an alloy including the metal. If a magnetic field is used to retain the die chuck 7430, the coupling component 7424 can include a ferromagnetic material.

In another implementation, more lands and zones may be used. As the number of lands and zones increase, a greater variety of die sizes may be used with a bonding head within the array of bonding heads 224. A die that can be transferred during a transfer operation can include a microprocessor, a microcontroller, a graphic processing unit, a digital signal processor, a memory die (for example, a Level 2 or Level 3 cache, a flash memory, or the like), a power transistor die, a power circuit die, a capacitor, an inductor, or the like. These different types of dies can vary greatly in their X-direction and Y-direction dimensions. For example, a microprocessor may have an X-direction dimension or a Y-direction dimension that is at least 3.5 cm, a chiplet may have an X-direction dimension and a Y-direction dimension that are each at most 0.5 cm, and a memory die may have an X-direction dimension and a Y-direction dimension that are each in a range of 0.6 cm to 3.4 cm.

The chiplet can be a die that has a component or a circuit that would occupy a significant amount of area, complicate a layout of a conduction path, cause too much capacitive or inductive coupling, or add an additional interconnect (wiring) level if the component or circuit would have been integrated into a die serving a different principal function, such as a microprocessor, a microcontroller, a graphic processing unit, a digital signal processor, or the like. A chiplet can provide a support function for another die and has a component or circuit that, from a timing standpoint, is static or operates at a frequency that is at least an order of magnitude less than a processor on the other die. The chiplet can help to reduce the size, simplify the layout, reduce parasitic capacitive or inductive coupling, reduce the number of interconnect levels, or a combination thereof for a microprocessor, a microcontroller, a graphic processing unit, a digital signal processor, or the like. In an implementation, a chiplet can be a capacitor having electrodes electrically coupled to power terminals (e.g., $V_{DD}$ and $V_{SS}$) of the other die (for example, a microprocessor). In another implementation, the chiplet can be an energy converter, such as a buck converter used to step down a higher direct current voltage (for example, 12 VDC) to a lower direct current voltage (for example, 1 VDC), where the output of the energy converter is used by the other die (for example, a microprocessor).

More lands and zones can allow the same die chuck to be used for a die that occupies a relatively smaller area and for another die that occupies a relatively larger area.

Figure 8:
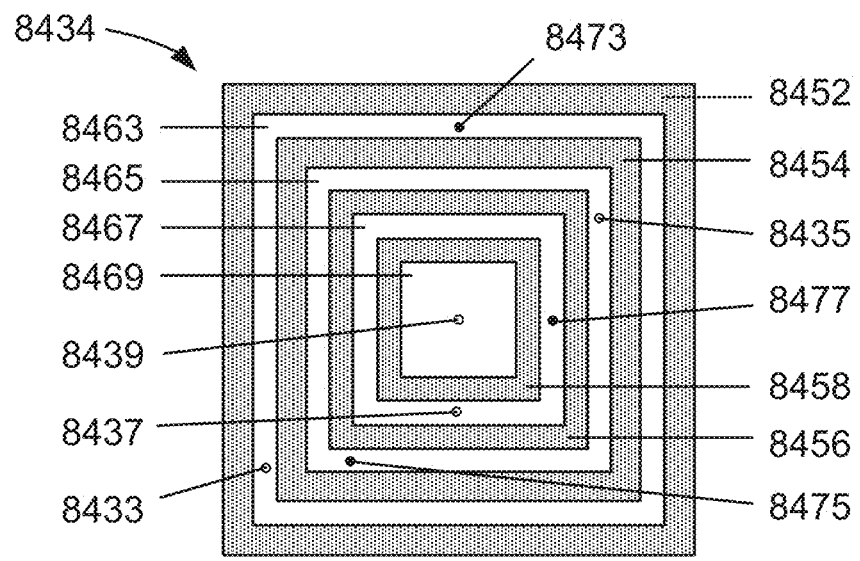
FIG. 8 includes an illustration of a bottom view of a portion of a die chuck that includes a mesa, lands, zones, and flow channels in accordance with another implementation.

FIG. 8 includes a bottom view of a mesa 8434 that is coupled to more lands as compared to the mesa 4434 in FIG. 6. The mesa 8434 includes lands 8452, 8454, 8456, and the zones 8463, 8465, 8467, and 8469 are disposed between pairs of lands. Each zone can be coupled to a flow channel to allow the zone to be pressurized with a pressurized gas, evacuated, or returned or maintained at ambient pressure. A flow channel 8433 is coupled to the zone 8463, a flow channel 8435 is coupled to the zone 8465, a flow channel 8437 is coupled to the zone 8467, and a flow channel 8439 is coupled to the zone 8469. As the numbers of lands and zones increase, routing of flow channels coupled to the ports may complicate the design of one or more components within the bonding head 424.

In an implementation, the flow channel 8433 can be part of a flow channel that extends into and to the side of the mesa 8434 closest to the left-hand part of FIG. 8, the flow channel 8435 can be part of a flow channel that extends into and to the side of the mesa 8434 closest to the right-hand part of FIG. 8, the flow channel 8437 can be part of a flow channel that extends into and to the side of the mesa 8434 closest to the bottom of FIG. 8, and the flow channel 8439 can be part of a flow channel that extends into and to the side of the mesa 8434 closest to the top of FIG. 8. In another implementation, all of the flow channels 8433, 8435, 8437, and 8439 can be parts of flow channels that extend into and to the same side of the mesa 8434, such as the side closest to the left-hand side or the right-hand side of FIG. 8. In a further implementation, some, but not all, of the flow channels can be routed to the same side. For example, the flow channels 8433 and 8437 can be parts of flow channels that extend into and to the side of the mesa 8434 closest to the bottom of FIG. 8, and the flow channels 8435 and 8439 can be part of a flow channel that extends into and to the side of the mesa 8434 closest to the top of FIG. 8. Although the flow channels are illustrated at specific locations, after reading this specification, skilled artisans can determine where flow channels should be located to meet the needs or desires for a particular application.

A sensor can be used to determine if a die covers a zone corresponding to the sensor. FIG. 8 includes a sensor 8473 within the zone 8463, a sensor 8475 within the zone 8465, and a sensor 8477 within the zone 8467. Each of the sensors 8473, 8475, and 8477 can be a light sensor, a pressure sensor, a proximity sensor, or the like. More than one sensor may be used for any or all of the zones 8463, 8465, and 8467. If desired, a sensor may be used within the zone 8469.

If a zone is covered by a die, little or no light will enter the zone, a vacuum within the zone will be sufficiently close to the vacuum pressure as measured by a vacuum gauge or at a regulator between the corresponding channel and a vacuum source, and the die will be close to a sensor. If a zone is not sufficiently covered by a die, a significant amount of light will enter the zone, a vacuum within the zone will be significantly less strong (closer to ambient pressure) as compared the vacuum pressure as measured by a vacuum gauge or at a regulator between the corresponding channel and a vacuum source, or the die will not exceed a threshold to be considered detected by a proximity sensor. One or more of the sensors may be electrically coupled to the controller 260 or a local controller.

When a die is being transferred from a pick-up head within the array of pick-up heads 244 to a bonding head within the array of bonding heads 224, the die may cover zones 8465, 8467, and 8469 and not cover the zone 8463. The sensors 8475 and 8477 can generate a signal that the zones 8465 and 8467 are covered, and the sensor 8473 may or may not generate a signal that the zone 8463 is not covered. The controller 260 or a local controller can determine that a pressure actuator corresponding to zone 8463 may not be activated or may be deactivated if previously activated because the zone 8463 is not covered by a die. The controller 260 or a local controller can determine that pressure actuators for the zone 8465, none, one, or both of the pressure actuators for the zones 8467 and 8469 are to be activated, so that the die can be held by the bonding head.

Before the die is bonded to a bonding site of a destination substrate, the controller 260 or the local controller and transmit a signal for the pressure actuator for the zone 8469 to introduce a pressurized gas into the zone 8469 to cause the die to bow away from the bonding head 424. The pressure within the zone 8467 can be at a pressure that is substantially the same as the pressure within the zone 8465 or 8469 or between the pressures of the zones 8465 and 8469 (for example, ambient pressure).

In the same or different implementation, the zone 8467 may be allowed to float. The term "float" means that the pressure within a zone is not controlled by its corresponding pressure actuator during at least a point in time, and such pressure can change in response to another condition or action. A non-limiting example helps to understand the concept of floating. When a die is transferred from the pick-up head to the bonding head, the controller 260 or a local controller can transmit a signal for pressure actuators for the zones 8465 and 8467 to activate and place the zones 8465 and 8467 under vacuum. Just before bowing, the controller 260 or a local controller can transmit a signal for the pressure actuator for the zone 8467 to backfill the zone 8467 so that the zone 8467 is at or near ambient pressure. After the zone 8467 is at or near ambient pressure, the controller 260 or a local controller can transmit a signal to deactivate the pressure actuator for the zone 8467. At this point in time, the zone 8467 floats.

The controller 260 or a local controller can transmit a signal for the pressure actuator for the zone 8469 (innermost zone) to allow a pressurized gas to flow to the zone 8469 to bow the die. As the die bows, the die may no longer contact the land 8458 (innermost land), and the zones 8467 and 8469 are no longer sealed from each other and are in fluid communication with each other. Because the zone 8467 is floating, the pressure within the zone 8467 may approach the pressure within the zone 8469. Floating the zone 8467 allows stress along the die's surface to be more uniformly spread between the center and the portion of the die that contacts the land 8456, which is adjacent to the evacuated zone 8465 to hold the die. If the pressure actuator for zone 8467 was trying to keep the zone 8467 at ambient pressure, the pressurized gas from the zone 8469 may flow into the flow channel coupled to the zone 8467 and possibly damage a pump or other vacuum/pressure source coupled to the zone 8467.

With a sufficient number of lands and zones, a single die chuck may be used for all dies that will be bonded to a destination substrate when using the apparatus. As the number of zones increase, the size of each zone may become small, and evacuating a single zone may be insufficient to hold a die during bowing. Thus, more than one zone may become evacuated to hold the die during bowing. Further, as the number of lands and zones increase, the design of the die chuck and the bonding head body can become complex and difficult to manufacture due at least in part to the number of flow channels needed for evacuating or pressurizing the zones. While in theory, the number of lands and zones is not limited, practical considerations may limit the number of lands and zones used for a die chuck. Thus, a die chuck may be used for relatively large and medium-sized dies, and another die chuck may be used for medium-sized and relatively small dies. After reading this specification, skilled artisans will be able to determine the layout of lands and zones for die chucks to meet the needs or desires for a particular application.

Figure 9:
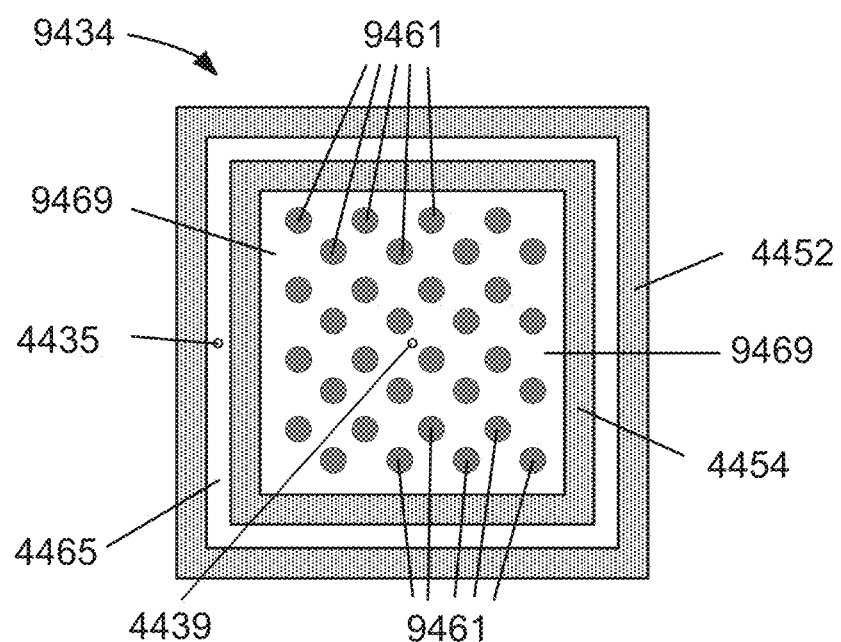
FIG. 9 includes an illustration of a bottom view of a portion of a die chuck that includes a mesa, lands, zones, pins, and flow channels in accordance with a further implementation.

FIG. 9 illustrates another implementation where pins are used. A mesa 9434 is identical to the mesa 4434 as illustrated in FIG. 6 except that a zone 9469 includes pins 9461 that extend from the mesa 9434 to distal surfaces that are seen in FIG. 9. The pins 9461 can help a die from being pulled too far into the zone 9469. For example, the zones 4465 and 9469 can be evacuated when a die is being transferred to the bonding head. The pins 9461 can help to limit how far the die can move into the zone 9469. In the same or different implementation, the pins 9461 may help to more uniformly distribute the downward force applied to a die when the die is being bonded to a destination substrate.

Distal surfaces of the pins 9461 and the lands 4452 and 4454 can be substantially co-planar. In an implementation, the surfaces along the distal surfaces of the pins 9461 and distal sides of the lands 4452 and 4454 can lie along planes that are within 5° of being co-planar. The pins 9461 and the lands 4542 and 4454 may be offset in the Z-axis, such that the any or all distal surfaces of the pins 9461 are at an elevation, as measured in the Z-direction, that is within 9 microns of the elevation of the distal surfaces of the lands 4452 and 4454. In another embodiment, the pins 9461 can extend from the mesa 9434 but may not extend fully to the elevation of the distal surfaces of the lands 4452 and 4454.

Although not illustrated, pins can be used in the die chucks corresponding to FIGS. 6 and 8.

For the implementations described herein, each zone can have its own corresponding flow path. The flow path can have an associated pressure actuator that can control the pressure, such as a vacuum, ambient pressure, or a positive pressure (greater than ambient pressure). The pressure actuator can be a valve or a regulator. In an implementation, the pressure actuator can include a combination of valves to allow a zone to be coupled to a vacuum source and a pressurization source. For example, the zone 8467 in FIG. 8 may be evacuated at one point in time during the method, at ambient pressure at another point in time during the method, and at a positive pressure at a further point in time in the method. The pressure actuator for the zone 8467 may be configured to have at least two valves to achieve the three different pressure states (vacuum, ambient pressure, and positive pressure). Any one or more of the pressure actuators in the apparatus can be controlled by the controller 260 or by a local controller. Pressure information from a pressure sensor can be received by the controller 260 or the local controller, and the controller 260 or the local controller can provide a signal to the corresponding pressure actuator to control the pressure within the flow path or zone.

A vacuum source can be coupled to a zone if the zone is to be evacuated, and a pressurization source can be coupled to a zone if the zone is to be pressurized to a positive pressure. The pressurization source can provide a gas to a zone to be pressurized. The gas can include air, nitrogen, argon, or another gas that is relatively inert to materials within the bonding head.

The shapes of the mesas 4434, 8434, and 9434 are illustrated in FIGS. 6, 8, and 9 as being square from a bottom view of the mesa. In another implementation, the mesa can have another polygon shape, such as a rectangle (not including a square), a pentagon, a hexagon, an octagon, or the like. In a further implementation, the mesa can have a circular shape or an oval shape.

The outermost lands are illustrated as having sides that are coterminous with the lateral sides of their corresponding mesas. In another implementation, the outermost land can be offset from one or more of the lateral sides of its corresponding mesa.

Figure 10:
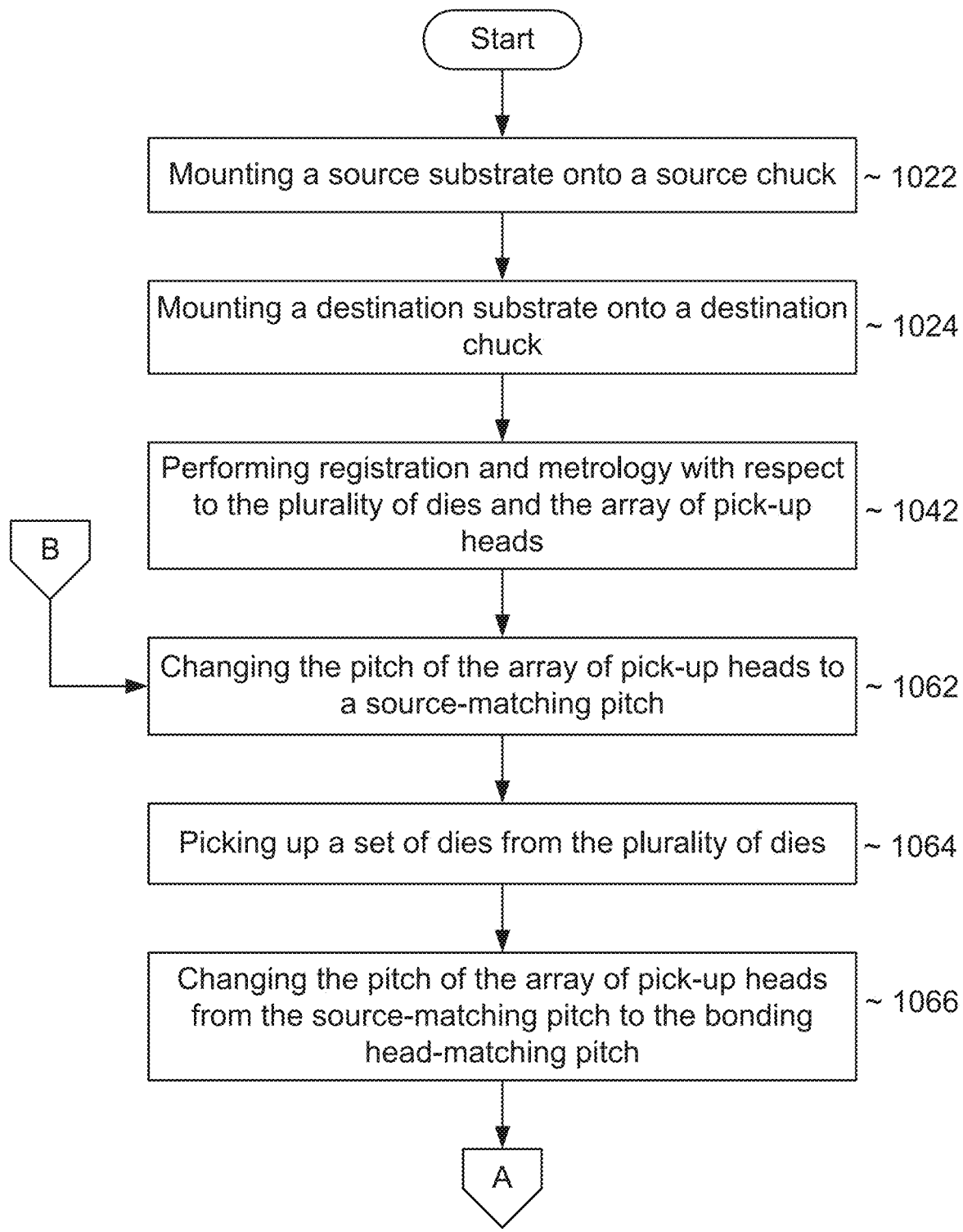
FIGS. 10 and 11 include a process flow diagram for a method of transferring dies from a source substrate to destination bonding sites of a destination substrate.
Figure 11:
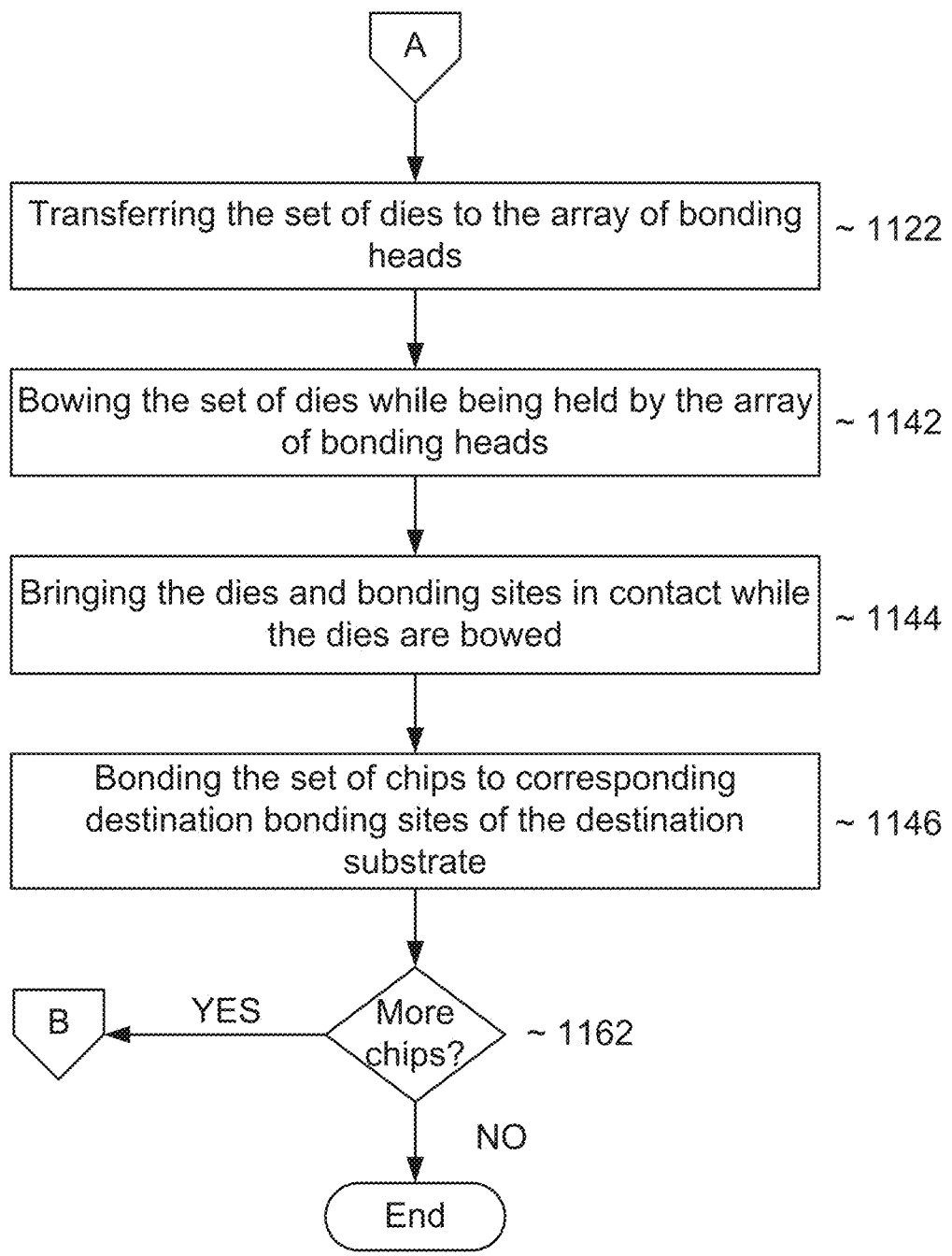

Attention is directed to methods of using the apparatus 200 when transferring a set of dies from a source substrate to bonding sites on a destination substrate. FIGS. 10 and 11 include a process flow diagram of a method that is described with respect to FIGS. 12 to 19. Some of the figures will be described with respect to a particular die within a set of dies and a bonding head within the array of bonding heads 224 to simplify understanding of the methods. Such description also applies to the other dies within the set of dies and the other bonding heads within the array of bonding heads 224. The methods will be described in reference to the apparatus 200 and its components as illustrated in FIGS. 2 to 6 unless explicitly stated to the contrary. After reading this specification, skilled artisans will appreciate that the methods can be used with respect to other apparatuses having other bonding heads as described herein with little or no modification to the methods.

In FIGS. 12 to 19, the space between (1) the bridge 220 and components coupled to the bridge 220 and (2) the base 240 and components coupled to the base 240 is greatly exaggerated to allow reference numbers and corresponding lead lines to be easier to see. In practice, the bridge 220 and base 240 may be significantly closer to each other than as illustrated. Further, the reference 226, the registration hardware 228 and 258, and alignment hardware 250 are not illustrated in FIGS. 12 to 19 to simplify understanding of the methods.

Before starting the method, the dies and destination substrate can be prepared such that the dies, the destination substrate, or both have activated surfaces to aid in bonding. After cleaning, a surface can be activated by exposing the surface to a plasma treatment and deionized water rinse to hydrate the surface. Where reasonably practical, contact with an activated surface should be avoided. In FIGS. 12 to 19, activated surfaces of the dies and destination substrate are illustrated as a dark band where bonding will occur.

Figure 12:
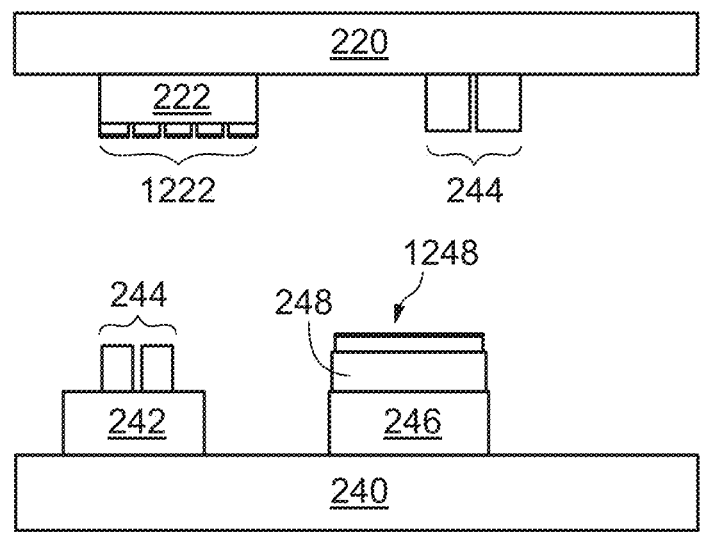
FIG. 12 includes an illustration of a cross-sectional view of the apparatus after a plurality of dies are coupled to a source chuck and a destination substrate is coupled to a destination chuck.

The method can include mounting a source substrate onto the source chuck at block 1022 and mounting a destination substrate onto a destination chuck at block 1024 in FIG. 10. As illustrated in FIG. 12, the pick-up head carriage 242 and the destination carriage 246 may be moved to allow easier access to the source chuck 222 and destination chuck 248. The actions in blocks 1022 and 1024 can be performed in either order.

Referring to FIG. 12, a plurality of dies 1222 can be attached to a source substrate (not illustrated) that is coupled to the source chuck 222 that is coupled to the bridge 220. The source substrate can hold the plurality of dies 1222, all of which or only a part of the plurality, are to be transferred to a destination substrate 1248. The source substrate can be an adhesive tape that may be in the form of a tape frame or a tape reel, a container having a lattice that defines a matrix of regions that can hold the plurality of dies 1222, or the like. The plurality of dies can have bonding surfaces that face the base 240 or a component coupled to the base 240.

Any die within the plurality of dies 1222 can include a microprocessor, a microcontroller, a graphic processing unit, a digital signal processor, a memory die (for example, a Level 2 or Level 3 cache, a flash memory, or the like), a power transistor die, a power circuit die, a capacitor, an inductor, or the like. The die has a device side, which has most or all of the electrical circuit elements of the die, and a back side opposite the device side. In the embodiment as illustrated in FIG. 12, the back sides of the dies within the plurality of dies 1222 are disposed between the source chuck 222 and the device sides of the dies. In another implementation, the device side of the dies within the plurality of dies 1222 are disposed between the source chuck 222 and the back sides of the dies. The sides of the dies facing the base 240 are activated for hybrid bonding to the destination substrate 1248.

The destination substrate 1248 can include any of the substrates described with respect to the source substrate and can also include a semiconductor wafer, a package substrate, a printed wiring board, a circuit board, an interposer, or the like. Microelectronic devices may be part of the destination substrate 1248, such as a semiconductor wafer. The package substrate, the printed wiring board, the circuit board, or the interposer may or may not have dies mounted thereto. Part or all of the sides of the destination substrate 1248 can be activated for hybrid bonding.

The method can include performing registration and metrology with respect to the plurality of dies and the array of pick-up heads at block 1042 in FIG. 10. Referring to FIGS. 2 and 12, the registration hardware 258 can pass under the source chuck 222 while the source substrate and the plurality of dies 1222 are coupled to the source chuck 222. Information from the registration hardware 258 can be transmitted to the controller 260 or a local controller and used to determine the source pitch for the plurality of dies 1222. The registration hardware 228 can pass over the destination chuck 248 while the destination substrate 1248 is coupled to the destination chuck 248. Information from the registration hardware 228 can be transmitted to the controller 260 or a local controller and used to determine the destination pitch for the destination substrate 1248 and to determine the destination pitch for the bonding sites of the destination substrate 1248 and locations of the bonding sites. If needed or desired, the information may be used to identify or confirm the plurality of dies 1222 and the destination substrate 1248 are correct dies and destination substrate for bonding.

In the same or different implementation, the method can further include preparing the source with dies in matching pitches to the destination substrate pitches. The array of pick up heads 244 is configured in advance to pick up multiple dies, and the array of bonding heads 224 is configured in advance to bond multiple dies in parallel. Therefore, no frequent adjustment of pitches is required for the pick up heads and bonding heads. In FIG. 10, block 1062 and block 1066 may be skipped in the case in which the pitch of the pick up heads matches the pitch of the bonding heads.

In a particular implementation where the pitch of the array of pick-up heads 244 is changed during a transfer cycle, the method can further include changing the pitch of the array of pick-up heads to a source-matching pitch at block 1062 in FIG. 10. The controller 260 or a local controller can transmit a signal for the pick-up heads within the array of pick-up heads 244 to be adjusted to have the source-matching pitch. The source-matching pitch can be the same or within an allowable tolerance of the source pitch.

Figure 13:
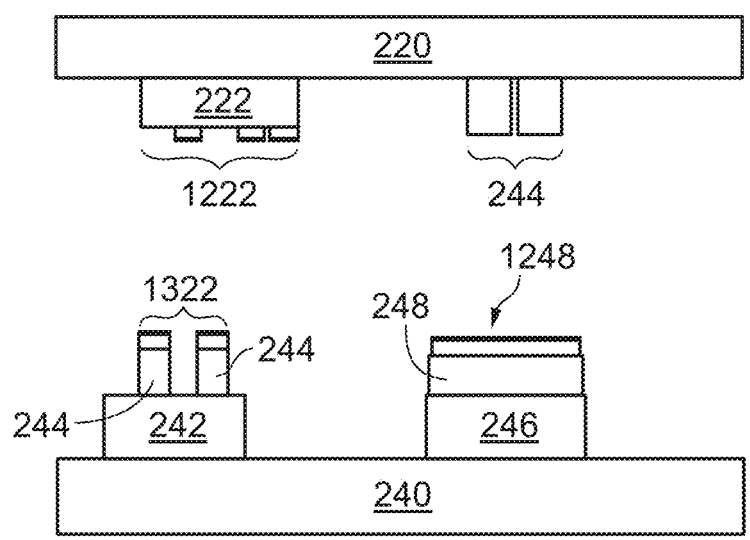
FIG. 13 includes an illustration of a cross-sectional view of the apparatus of FIG. 12 after the array of pick-up heads picked up a set of dies from a source substrate.

The method can include picking up a set of dies from the plurality of dies at block 1064 in FIG. 10. The controller 260 or a local controller can transmit a signal for the pick-up heads of the array of pick-up heads 244 to be extended in the Z-direction and pick up a set of dies 1322 as illustrated in FIG. 13. The dies that are picked up may be dies that are closest to each other, or one or more other dies may be between the picked-up dies, such as illustrated in FIG. 13. Dies that are not picked up remain coupled to the source chuck 222 as illustrated in FIG. 13.

In an embodiment, the array of pick-up heads 244 do not contact the activated surfaces of the dies being transferred. The die chucks for the array of pick-up heads 244 can have a design that allows dies to be picked up along side surfaces of the dies, where the side surfaces are between the device and back sides of the dies. Referring to FIG. 3, the die chuck 3444 with its projections 3448 can allow dies to be picked up by the sides, so that an activated surface of the die does not contact the pick-up surface 3446. In another implementation, the array of pick-up head 244 can include Bernoulli chucks.

Figure 14:
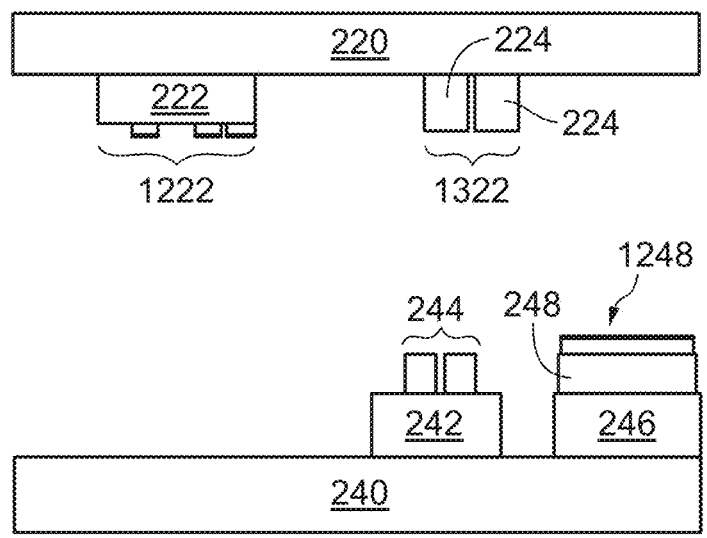
FIG. 14 includes an illustration of a cross-sectional view of the apparatus of FIG. 13 after transferring the set of dies from the array of pick-up heads to an array of bonding heads.

The method can further include changing the pitch of the array of pick-up heads from the source-matching pitch to the bonding head-matching pitch at block 1066 in FIG. 10. Referring to FIGS. 13 and 14, the pitch for the array of pick-up heads 244 is changed from the source-matching pitch to the bonding head-matching pitch. The controller 260 or a local controller can transmit a signal for the pick-up heads within the array of pick-up heads 244 to move to achieve the desired pitch. The set of dies 1322 are coupled to the array of pick-up heads 244 when the pitch for the array of pick-up heads 244 is changed. The bonding head-matching pitch for the array of pick-up heads 244 can be the same or within an allowable tolerance of the bonding head pitch for the array of bonding heads 224.

The method can include transferring the set of dies to the array of bonding heads at block 1122 in FIG. 11. Referring to FIGS. 13 and 14, the pick-up head carriage 242 and destination carriage 246 are moved to the right. The pick-up head carriage 242 is moved so that the array of bonding heads 224 is over the array of pick-up heads 244. Referring to FIGS. 2 and 14, if needed or desired, the registration hardware 228, 258, or both can be used to confirm the array of pick-up heads 244 is properly positioned with respect to the array of bonding heads 224. The controller or a local controller can transmit a signal for the pick-up heads within the array of pick-up heads 244 to be extended toward the bonding heads within the array of bonding heads 224, for the bonding heads within the array of bonding heads 224 to be extended toward the pick-up heads within the array of pick-up heads 244, or both.

Referring to FIGS. 2, 5, and 6, the controller 260 or a local controller can transmit a signal for the pressure actuator 5435 for the bonding head 424 to activate the pressure actuator 5435 to evacuate the flow channel 5425 and the zone 4465. The vacuum within the zone 4465 can be sufficient to hold a die within the set of dies 1322. The zone 4469 can be at or near ambient pressure or be evacuated similar to the zone 4465. The controller 260 or local controller may or may not transmit a signal to activate the pressure actuator 5439 to achieve the desired pressure (vacuum or at or near ambient pressure) for the zone 4469.

Figure 15:
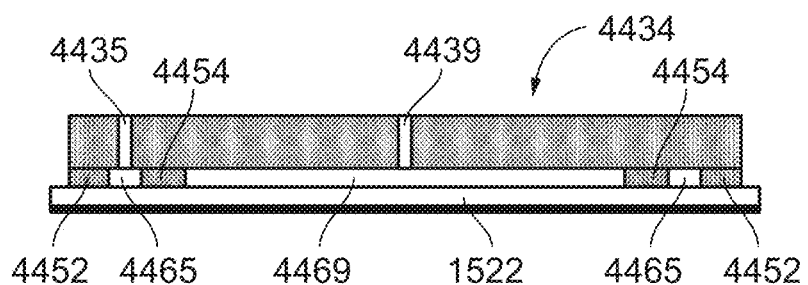
FIG. 15 includes an illustration of a cross-sectional view of a portion of a die chuck and a particular die when the die is in a relaxed state (not bowed).

FIG. 14 includes the set of dies 1322 after the set of dies 1322 is transferred from the array of pick-up heads 244 to the array of bonding heads 224. FIG. 15 includes a particular die 1522 within the set of dies 1322 that is held by a bonding head within the array of bonding heads 224. FIG. 15 includes many of the features previously described. The die chuck body 4432, the sealing member 4422, the bonding head body 4412, and their corresponding flow channels and actuators for the bonding head 424 are present but are not illustrated in FIGS. 15 to 17 to simplify understanding of the concepts described herein.

The method can further include bowing the set of dies while being held by the array of bonding heads at block 1142 in FIG. 11. Data can be useful in determining how much pressurization should be used. For example, as a die occupies a larger area (X-direction and Y-direction dimensions) and is thinner (Z-direction dimension), less pressure is needed to bow the die as compared to a die that occupies a smaller area and is thicker. If the die is attached to a backing plate, the combined thickness of the die and backing plate can be used. The thicknesses of the dies alone or the combinations of dies and their corresponding backing plates can be in a range from 20 microns to 700 microns or from 20 microns to 300 microns. The methods described herein are well suited for thicknesses of at most 100 microns. The data can be obtained for many different die areas and thicknesses. The memory 162 or a table or database external to the apparatus 200 can have data that correlates different areas and thicknesses of the die and the positive pressures or ranges of positive pressures to use to allow for sufficient bowing of the dies. The information can be empirical data collected before using the data in production.

Figure 16:
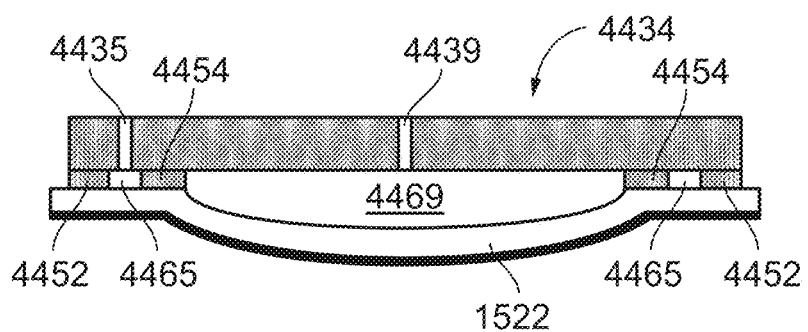
FIG. 16 includes an illustration of a cross-sectional view of the portion of the die chuck and the particular die of FIG. 15 when the particular die is bowed.

Referring to FIGS. 2, 5, 6, and 16, the controller 260 or a local controller transmits a signal for the pressure actuator 5439 to be activated and allow a pressurized gas to increase the pressure within the flow channel 5429 and the zone 4469. Pressure sensor 5459 can sense the pressure within the flow channel 5429 and transmit signals to the controller 260 or the local controller, so that the controller 260 or the local controller can control the pressure to be at or within acceptable tolerance of a targeted pressure. As the pressure within the zone 4469 increases, the dies bow away from the bonding head 424 and toward the base 240 or a component or the destination substrate 1248 that is coupled to the base 240 (seen in FIG. 14). FIG. 16 illustrates the particular die 1522 from the set of dies 1322. The other dies within the set of dies 1322 can have a bowed shape similar to the particular die 1522.

Figure 17:
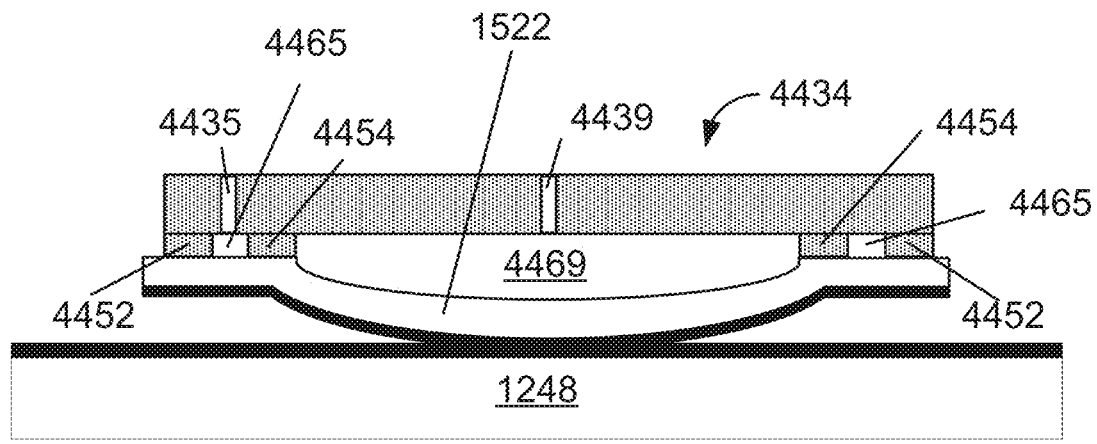
FIG. 17 includes an illustration of a cross-sectional view of the portion of the die chuck, a portion of the destination substrate, and the particular die of FIG. 16 when the particular die is bowed and makes initial contact with the destination substrate.
Figure 18:
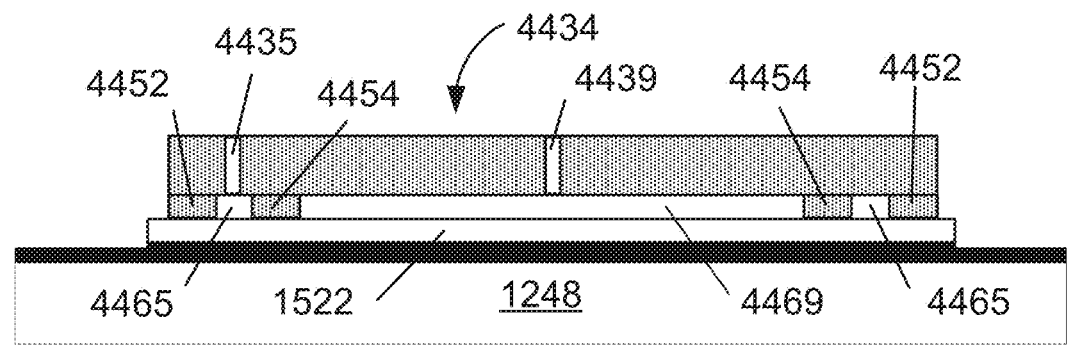
FIG. 18 includes an illustration of a cross-sectional view of the portion of the die chuck, the portion of the destination substrate, and the particular die of FIG. 17 during bonding the particular die to the destination substrate.

The method can include bringing the dies and bonding sites in contact while the dies are bowed at block 1144 in FIG. 11. Referring to FIGS. 2, 4, 5, and 17, the bonding heads within the array of bonding heads 224 can be extended toward the destination substrate 1248, the destination chuck 248 can be extended toward the array of bonding heads 224, or both. As illustrated in FIG. 17, the outer surface of the particular die 1522 is smoother and less jagged as compared to the outer surface of the die 122 illustrated in FIG. 1. Thus, the likelihood of trapped air between the particular die 1522 and destination substrate 1248 during bonding is substantially less than the likelihood of trapped air between the die 122 and the substrate 148 in FIG. 1.

The method can further include bonding the set of dies to corresponding bonding sites of the destination substrate at block 1146 in FIG. 11. Referring to FIGS. 2, 4, 5, and 18, the bonding heads for the array of bonding heads 224 can be further extended toward the destination substrate 1248, the destination chuck 248 can be extended toward the array of bonding heads 224, or both. Pressure is exerted to bond the set of dies 1322 to corresponding bonding sites of the destination substrate 1248. In an embodiment, the bonds can be oxide-to-oxide bonds. The pressure during bonding can be in a range from 0.5 N/cm$^2$ to 20 N/cm$^2$. The controller 260 or a local controller can transmit a signal for a motor, hydraulic pressure, or another mechanical component that can be used to drive the array of bonding heads 224, the destination chuck 248, or both in the Z-direction to achieve the bonding pressure. During bonding, if needed or desired, the pressure within the zone 4469 can be at a positive pressure that is at or within a tolerance of the pressures exerted by the motor, the hydraulic pressure, or other mechanical component to allow for more uniform pressure along the surface of the set of dies 1322, including the particular die 1522 illustrated in FIG. 18, during bonding. In another implementation, the pressure within the zone 4469 can be at or near ambient pressure. In the same or different implementation, the pressure within the zone 4465 can remain at vacuum pressure, be at or near ambient pressure, or a pressure that is substantially the same as within the zone 4469.

Figure 19:
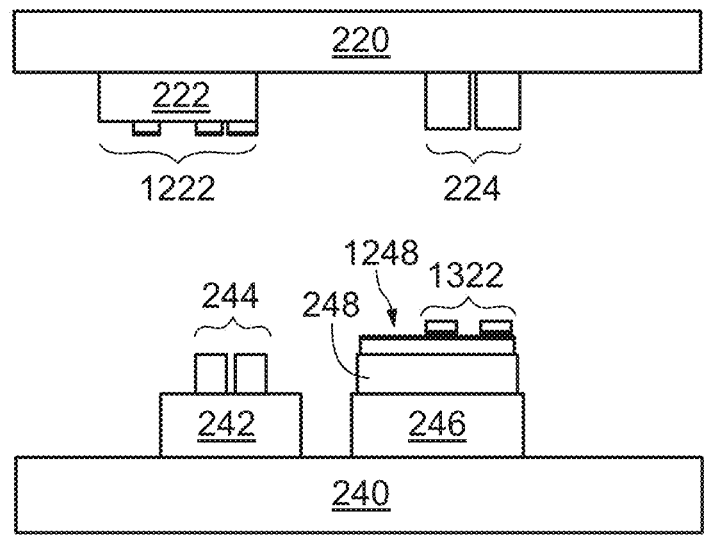
FIG. 19 includes an illustration of a cross-sectional view of the apparatus after bonding the set of dies and the destination substrate.

The bonding can be performed at room temperature (for example, at a temperature in a range from 20° C. to 25° C.) or higher. Bonding is performed at a temperature less than a subsequent anneal to expand conductive metal within the dies and at the bonding sites. The temperature may be limited depending on films present during bonding or components within the apparatus 200. For example, the temperature may be no higher than approximately 200° C. After reading this specification, skilled artisans will be able to determine the pressure and temperature used for bonding. FIG. 19 includes a cross-sectional view of the apparatus 200 after the set of dies 1322 are bonded to corresponding bonding sites of the destination substrate 1248. At this point in the method, one transfer cycle has been completed.

A determination is made whether more dies are to be transferred from the source substrate to the destination substrate at decision diamond 1162 in FIG. 11. If more dies are to be transferred ("YES" branch), the method continues starting at block 1062 in FIG. 10 with a next set of dies transferred during another transfer cycle. The method can be iterated as many times as needed for the destination substrate 1248 to have a desired number of dies. If no more dies are to be transferred ("NO" branch from decision diamond 1162 in FIG. 11), the transfer operation is completed, and the method of transferring dies ends.

A hybrid bonding process can include three steps that include a bonding operation, a first anneal to cause the metal within the dies and at the destination bonding sites to expand and contact each other, and an optional second anneal to cause metal atoms to cross the metal-metal interface and reduce contact resistance. The previously described methods correspond to the bonding operation.

After all of the transfer cycles have been performed and the transfer operation is completed, the destination substrate 1248 and the corresponding bonded dies can be annealed at a temperature in a range from 180° C. to 400° C. In an embodiment, annealing may be performed at one or more temperatures. As the temperature of the conductive metal increases, the conductive metal expands. The conductive metal in electrical components within the destination substrate 1248 contacts the conductive metal in the bonded dies to make a physical and electrical coupling between the conductive materials. If needed or desired, the anneal temperature can be increased further, so that atoms from the conductive metals can cross the interfaces between the electrical components in the destination substrate 1248 and the bonded dies and reduce contact resistance. In an embodiment, the physical and electrical coupling can be a physical and electrical connection. Thus, the bonded dies and the sets of electrical components in the destination substrate 1248 can allow voltages to be passed and current to flow between the bonded dies and the sets of electrical components. The destination substrate 1248 can be removed from the apparatus 200 or moved to a different portion of the apparatus 200 or a different tool to perform the anneal operations.

The methods previously described can be used with other die chucks. FIGS. 6, 8, and 9, illustrate different die chucks can be used for bonding heads with the array of bonding heads 224. The method previously described is applicable to the die chuck 4430 in FIG. 6, may be used for the die chuck having the mesa 8434 and other features in FIG. 8, and the die chuck having the mesa 9434 and other features in FIG. 9. Other methods may be used for the die chucks.

Figure 20:
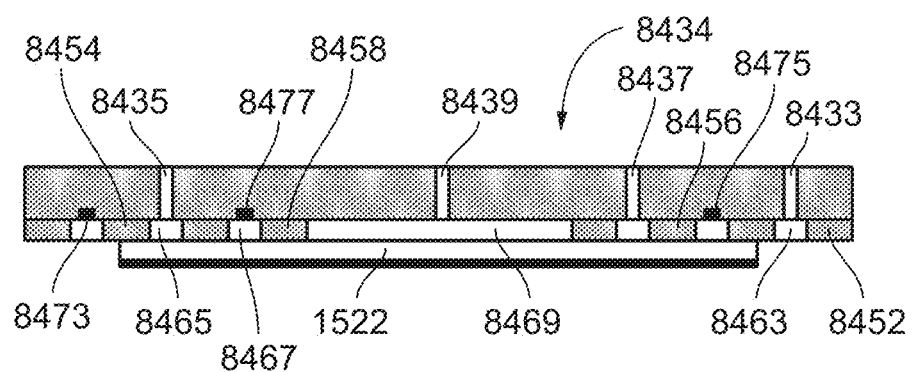
FIG. 20 includes an illustration of a cross-sectional view of the portion of the die chuck corresponding to the design of FIG. 8 and a particular die held by the bonding head when the die is in a relaxed state (not bowed).

Referring to FIGS. 8 and 20, the die chuck can have the mesa 8434 that is coupled to the lands 8452, 8454, 8456, and 8458 defining zones 8463, 8465, 8467, and 8469. Each of the zones 8463, 8465, 8467, and 8469 has a corresponding flow channel 8433, 8435, 8437, or 8439. Zones 8463, 8465, and 8467 have corresponding sensors 8473, 8475, and 8477, respectively. The zone 8469 may or may not have a corresponding sensor or it may be at another location within the bonding head. As compared to FIG. 8, some of the features in FIG. 20 are illustrated at different locations to improve understanding of the method when using the die chucks. FIG. 20 includes the particular die 1522 when the particular die 1522 is being held by a bonding head that has a die chuck that includes a multi-zone design. The number of sensors for each zone can be greater than what is illustrated in FIGS. 8 and 20, especially when light or proximity sensors are used.

As previously described, information regarding dies that can be used with the apparatus 200 can be stored within the memory 262 or within a table or database external to the apparatus. A part number or other identifier or X-direction and Y-direction dimensions for the dies being transferred from the source substrate to the destination substrate can be obtained by or input into the controller 260 or the local controller. Such information can be used by the controller 260 or a local controller to determine which zones are covered by the dies and which zones are not covered by the dies. Referring to FIG. 20, even before the particular die 1522 is held by the bonding head, the controller 260 or the local controller can have information that zone 8463 will not be covered by the particular die 1522 and the zones 8465, 8467, and 8469 will be covered by the particular die 1522.

Alternatively, the apparatus 200 can automatically determine whether a particular zone is covered or not covered by a die. The sensors 8473, 8475, and 8477 can be used to sense which if any of the zones 8463, 8465, and 8467 are covered. Referring to FIG. 20, if the sensors sense light, the sensor 8473 can transmit a signal to the controller 260 or a local controller that a significant amount of light is sensed, and the sensors 8475 and 8477 can transmit signals to the controller 260 or a local controller that no light or an insignificant amount of light is sensed. If the sensors are proximity sensors, the sensor 8473 can transmit a signal to the controller 260 or a local controller that an object is not present, and the sensors 8475 and 8477 can transmit signals to the controller 260 or a local controller that an object is detected.

If the sensors are pressure sensors, the controller or a local controller can transmit signals to activate the pressure actuators coupled within the flow channels 8433, 8435, and 8437 to draw a vacuum within the flow channels 8433, 8435, and 8437. The sensor 8473 can sense that the pressure within the zone 8463 is at or near ambient pressure, and the sensors 8475 and 8477 can sense that the pressures within the zones 8465 and 8467 are substantially less than the ambient pressure. The sensors 8473, 8475, and 8477 can transmit signals to the controller 260 or the local controller regarding pressures within the zones 8463, 8465, and 8467. In another implementation, the sensors are outside the die chuck and further upstream along a flow channel can be used. For example, referring to FIG. 5, the pressure sensor 5459 can be used to sense the pressure corresponding to the flow channel 4439 and the zone 4469. Similar pressure sensors can be used to sense pressure within the flow channels 8433, 8435, and 8437.

The controller 260 or the local controller can receive the information from the sensors 8473, 8475, and 8477 and determine that the particular die 1522 does not cover the zone 8463 and covers the zones 8465 and 8467. If the pressure actuator for the flow channel 8433 was activated during the sensing phase of the method, the controller 260 or the local controller can transmit a signal for the pressure actuator corresponding to the zone 8463 to be deactivated before continuing with bonding the particular die 1522 to the destination substrate 1248.

Figure 21:
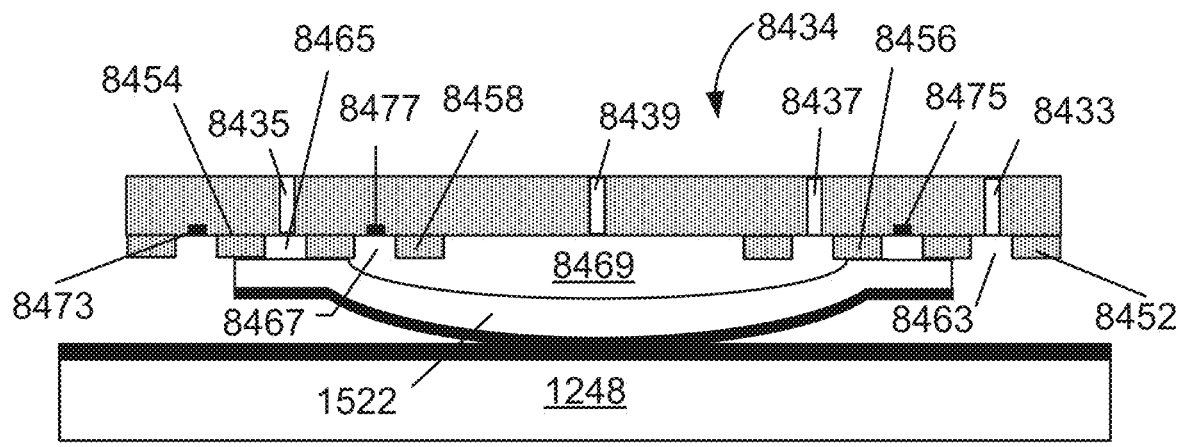
FIG. 21 includes an illustration of a cross-sectional view of the portion of the die chuck, a portion of the destination substrate, and the particular die of FIG. 20 when the particular die is bowed and makes initial contact with the destination substrate.

Referring to FIG. 21, the particular die 1522 can be bowed similar to a prior implementation. The zone 8465 can remain under vacuum to hold the particular die 1522. The controller 260 or the local controller can transmit a signal for the pressure actuator coupled to the flow channel 8437 to be deactivated so that the flow channel 8437 is no longer coupled to a vacuum source. The controller 260 or the local controller can transmit a signal for the pressure actuator 5439 (FIG. 5) to pressurize the flow channel 8439 to increase the pressure within the zone 8469 to bow the particular die 1522. As the particular die 1522 bows, the particular die 1522 may no longer be in contact with the land 8458, and the zone 8467 is in fluid communication with the zone 8469.

In an implementation, the controller 260 or the local controller can transmit signals for the pressure actuators coupled to the flow channels 8437 and 8439 to activate and pressurize the zones 8467 and 8469. In another implementation, the zone 8467 can float, meaning that the zone 8467 is not controlled by a pressure actuator upstream from the flow channel 8437 but will be at or close to the pressure within the zone 8469 as gas from the zone 8469 flows into the zone 8467 after the particular die 1522 no longer contacts the land 8458. In another particular implementation involving floating, the controller 260 or the local controller can activate a pressure actuator coupled to the flow channel 8437 to allow the zone 8467 to reach or become close to the ambient pressure before bowing begins. This can help to reduce the pressure differential between the zones 8467 and 8469 during the start of bowing and before the particular die 1522 no longer contacts the land 8458. Floating the zone 8467 can provide an advantage over using a pressure actuator upstream from the flow channel 8437 because it may be difficult to keep the pressure within the flow channels 8437 and 8439 the same.

Figure 22:
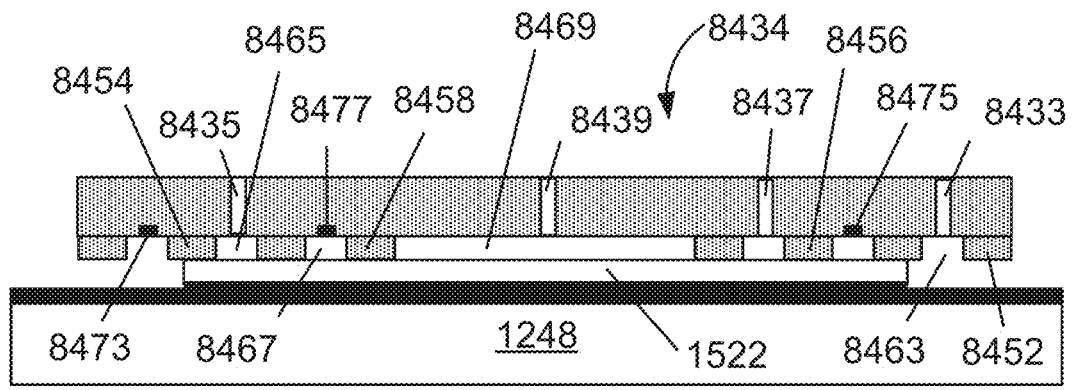
FIG. 22 includes an illustration of a cross-sectional view of the portion of the die chuck, the portion of the destination substrate, and the particular die of FIG. 21 during bonding the particular die and the destination substrate.

The method can further include bonding the particular die 1522 to the destination substrate 1248 at a bonding pressure as previously described. FIG. 22 includes an illustration during bonding of the particular die 1522 to the destination substrate 1248. The zones 8465, 8467, and 8469 can be any of the pressures as described with respect to bonding regarding FIG. 18. The zones 8465, 8467, and 8469 can have the same or different pressures as compared to each other during bonding.

Figure 23:
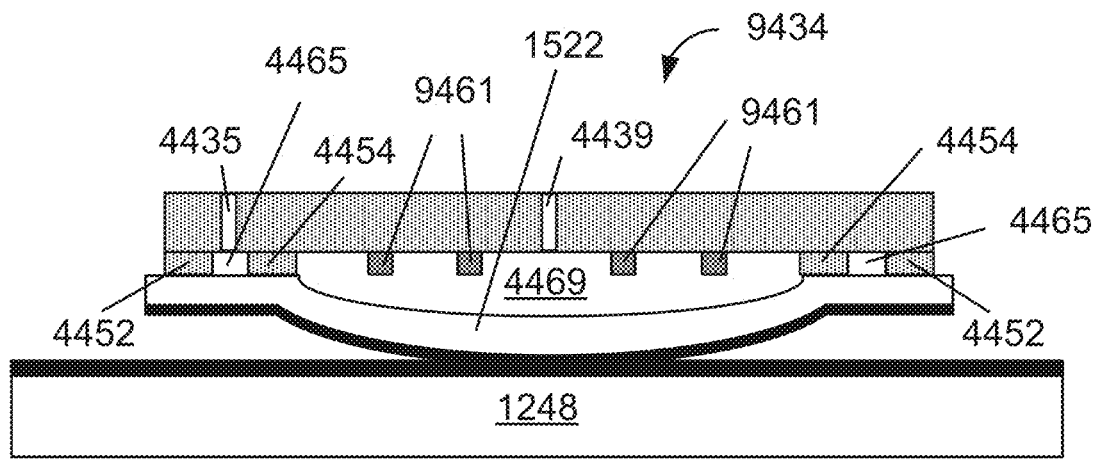
FIG. 23 includes an illustration of a cross-sectional view of the portion of the die chuck corresponding to the design of FIG. 9, a portion of the destination substrate, and a particular die held by the bonding head when the particular die is bowed and makes initial contact with the destination substrate.
Figure 24:
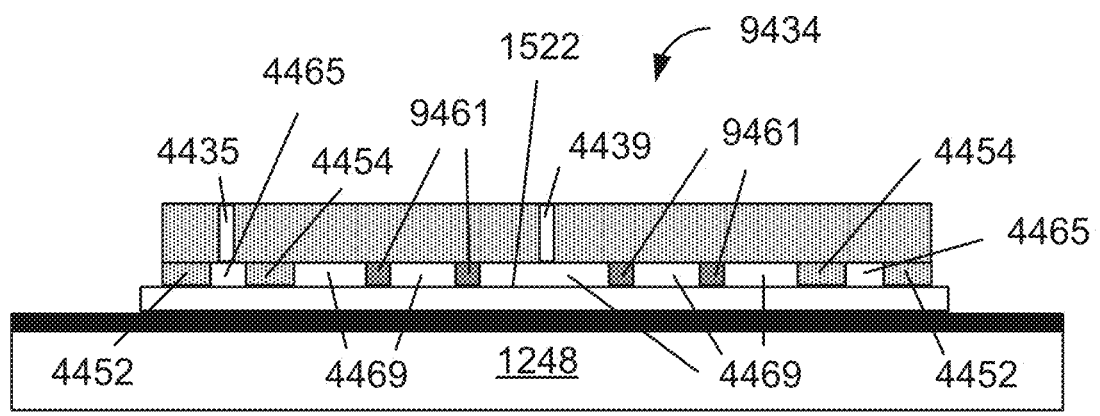
FIG. 24 includes an illustration of a cross-sectional view of the portion of the die chuck, the portion of the destination substrate, and the particular die of FIG. 23 during bonding the particular die and the destination substrate.

FIGS. 23 and 24 illustrate bonding using the die chuck using the mesa 9434 and pins 9461 as previously illustrated and described in FIG. 9. In an implementation, the distal surfaces of the lands 4452 and 4454 and the pins 9461 can lie at the same elevation. The method is described with respect to the apparatus 200 except that the mesa 9434 and the pins 9461 replace the mesa 4434 as illustrated in FIGS. 4 to 6. In FIGS. 2, 4 to 6 and 23, the controller 260 or a local controller can transmit a signal for the pressure actuator 5435 to activate and evacuate the flow channel 5425, including the flow channels 4415, 4425, and 4435, and the zone 4465. The controller 260 or a local controller can transmit a signal for the pressure actuator 5439 to activate and flow a pressurized gas into the flow channel 5429, including the flow channels 4419, 4429, and 4439, and the zone 4469. The zone 4469 is at a positive pressure and causes the particular die 1522 to bow and become spaced apart from the pins 9461. Similar to other implementations, the center of the particular die 1522 initially contacts the destination substrate 1248.

The method can further include bonding the particular die 1522 to the destination substrate 1248 at a bonding pressure as previously described. Referring to FIG. 24, during bonding, the distal surfaces of the lands 4452 and 4454 and the distal surfaces of the pins 9461 contact the particular die 1522. The combination of the lands 4452 and 4454 and the pins 9461 can distribute the pressure more uniformly along the surface of the particular die 1522. Either or both of the zones 4465 and 4469 can be at ambient pressure, at a positive pressure that corresponds to the pressure exerted onto the particular die 1522 by the lands 4452 and 4454 and the pins 9461, or at a pressure between such pressures.

Following the transfer operation using the die chuck corresponding to the design in FIG. 8 or 9, an anneal operation as previously described can be performed to complete electrical coupling between the bonded dies and set of electrical components within the destination substrate.

The apparatuses and methods of using the apparatuses can help to reduce the likelihood of forming voids along an interface between a destination substrate and dies bonded to the destination substrate when using a hybrid bonding technique. Dies being bonded to a destination substrate can be bowed by a pressurized gas to allow a more gradual curvature along the surfaces of the dies that initially make contact with the destination substrate. The surfaces of the dies are less likely to have a jagged surface as seen in FIG. 1. Thus, the apparatuses and methods are less likely to allow air to become trapped between the dies and the destination substrate. Overlay error between the dies and the destination substrate is reduced.

A variety of designs can be used for the mesas, lands, and pins for the die chuck coupled to the bonding head body. The design illustrated in FIGS. 5 and 6 allows for a relatively simple design that works well for dies that occupy similar areas. The design illustrated in FIG. 8 has a plurality of zones that can be used for dies having different sizes. Thus, die chucks may not need to be changed as frequently as compared to the design in FIGS. 5 and 6. The design illustrated in FIG. 9 has pins in addition to lands. The pins can help to keep a die from being pulled as far into a zone when the zone is evacuated as compared to the same design without pins. Further, the pins can help provide contact to a side of a die to help in the bonding operation.

Note that not all of the activities described above in the general description, or the examples are required, that a portion of a specific activity may not be required, and that one or more further activities can be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:
1. An apparatus, comprising:
  a bonding head comprising;
    a bonding head body;
    a die chuck body coupled to the bonding head body and having a proximal side and a distal side, wherein the bonding head body is closer to the proximal side than to the distal side;
    a first land closer to the distal side than to the proximal side; and
    a second land closer to the distal side than to the proximal side, wherein:
      the second land is spaced apart from and laterally surrounded by the first land,
      a first zone is disposed between the first land and the second land, and
      a second zone is laterally surrounded by the second land;

a first pressure actuator configured to provide a first vacuum within the first zone, wherein the first vacuum is sufficient to hold a die; and a second pressure actuator configured to provide a pressure to the second zone, wherein the pressure is sufficient to bow the die while the die is being held by the first vacuum within the first zone.

2. The apparatus of claim 1, wherein the die chuck body is configured to transmit less than 9% of radiation in a range from 100 nm to 1000 nm.

3. The apparatus of claim 1, wherein the die chuck body includes a material present in a sufficient amount to dissipate electrical charge.

4. The apparatus of claim 1, wherein the apparatus does not have a radiation source configured to emit radiation along the proximal side of the die chuck body, wherein the radiation is in a range from 100 nm to 1000 nm.

5. The apparatus of claim 1, wherein the die chuck body is releasably coupled to the bonding head body.

6. The apparatus of claim 1, further comprising a holding means for holding the bonding head body and the die chuck body together.

7. The apparatus of claim 1, further comprising a third land laterally surrounding the first land, wherein a third zone disposed between the first land and the third land.

8. The apparatus of claim 7, further comprising a sensor to sense a state of the third zone.

9. The apparatus of claim 7, further comprising a holding means for holding the bonding head body and the die chuck body together, wherein the holding means comprises a third pressure actuator coupled to the third zone, wherein a combination of the first pressure actuator and the third pressure actuator are configured to provide a second vacuum sufficient to hold the die chuck body and the bonding head body together.

10. The apparatus of claim 1, wherein the apparatus further comprises a first drive means configured to generate a pressure in a range from 0.5 N/cm² to 20 N/cm² between the first land of the bonding head and an object while the first land of the bonding head and the object are in contact with each other.

11. The apparatus of claim 1, further comprising a mesa disposed between the die chuck body and each of the first land and the second land.

12. The apparatus of claim 1, further comprising a pin within the second zone.

13. The apparatus of claim 12, wherein the pin, the first land, and the second land have surfaces that lie at substantially a same elevation from the distal side of the die chuck body.

14. An apparatus, comprising:
a first bonding head comprising;
a first bonding head body;
a first die chuck body coupled to the first bonding head body and having a first proximal side and a first distal side, wherein the first bonding head body is closer to the first proximal side than to the first distal side;
a first land closer to the first distal side than to the first proximal side;
a second land closer to the first distal side than to the first proximal side, wherein:
the second land is spaced apart from and laterally surrounded by the first land,
a first zone is disposed between the first land and the second land, and
a second zone is laterally surrounded by the second land;
a first pressure actuator configured to provide a first vacuum within the first zone, wherein the first vacuum is sufficient to hold a first die;
a second pressure actuator configured to provide a first pressure to the second zone, wherein the first pressure is sufficient to bow the first die while the first die is being held by the first vacuum within the first zone;
a second bonding head comprising:
a second bonding head body;
a second die chuck body coupled to the second bonding head body and having a second proximal side and a second distal side, wherein the second bonding head body is closer to the second proximal side than to the second distal side;
a third land closer to the second distal side than to the second proximal side; and
a fourth land closer to the second distal side than to the second proximal side, wherein:
the fourth land is spaced apart from and laterally surrounded by the third land,
a third zone is disposed between the third land and the fourth land, and
a fourth zone is disposed laterally surrounded by the fourth land;
a third pressure actuator configured to provide a second vacuum within the third zone, wherein the second vacuum is sufficient to hold a second die;
a fourth pressure actuator configured to provide a second pressure to the fourth zone, wherein the second pressure is sufficient to bow the second die while the second die is being held by the second vacuum within the third zone; and
a controller configured such that the first bonding head can bond the first die to a destination substrate and the second bonding head can bond the second die to the destination substrate during a same point in time.

* * * * *